United States Patent
Kim et al.

(10) Patent No.: US 8,502,243 B2
(45) Date of Patent: Aug. 6, 2013

(54) DISPLAY SUBSTRATE, METHOD OF MANUFACTURING THE DISPLAY SUBSTRATE, AND DISPLAY DEVICE HAVING THE DISPLAY SUBSTRATE

(75) Inventors: Hyun-Wuk Kim, Ansan-si (KR); Sung-Tae Shin, Suwon-si (KR); Kyeong-Hyeon Kim, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 326 days.

(21) Appl. No.: 12/840,202

(22) Filed: Jul. 20, 2010

(65) Prior Publication Data

US 2011/0079782 A1    Apr. 7, 2011

(30) Foreign Application Priority Data

Oct. 6, 2009   (KR) .................. 10-2009-0094488

(51) Int. Cl.
*H01L 29/20* (2006.01)

(52) U.S. Cl.
USPC .. 257/89; 257/88; 257/E33.067; 257/E33.068

(58) Field of Classification Search
USPC ........... 257/88–89, 88–89, E33.067, E33.068
See application file for complete search history.

(56) References Cited

U.S. PATENT DOCUMENTS

| | | | |
|---|---|---|---|
| 7,046,314 B2* | 5/2006 | Hayase et al. | 349/43 |
| 2003/0227678 A1* | 12/2003 | Lines et al. | 359/486 |
| 2006/0061519 A1* | 3/2006 | Fisher et al. | 345/32 |
| 2007/0019292 A1* | 1/2007 | Kim et al. | 359/486 |
| 2008/0100781 A1* | 5/2008 | Choo et al. | 349/96 |
| 2008/0218656 A1* | 9/2008 | Kim | 349/62 |

FOREIGN PATENT DOCUMENTS

| | | |
|---|---|---|
| JP | 2001-074935 | 3/2001 |
| JP | 2006-084776 | 3/2006 |
| JP | 2008-083657 | 4/2008 |
| JP | 2008-139604 | 6/2008 |
| JP | 2009-003345 | 1/2009 |
| JP | 2009-042319 | 2/2009 |
| KR | 10-2004-0100002 A | 12/2004 |
| KR | 10-2007-0056837 A | 6/2007 |
| KR | 10-2007-0096905 A | 10/2007 |
| KR | 10-2008-0037324 A | 4/2008 |
| KR | 10-2008-0052200 A | 6/2008 |
| KR | 10-2009-0011916 A | 2/2009 |
| KR | 10-2009-0032467 A | 4/2009 |

* cited by examiner

*Primary Examiner* — Matthew Reames
(74) *Attorney, Agent, or Firm* — Innovation Counsel LLP

(57) ABSTRACT

A display substrate includes a base substrate, a first dielectric layer, a first lattice pattern, a second lattice pattern, and a second dielectric layer. The first lattice pattern is disposed on the first dielectric layer at a first color pixel region. The first lattice pattern includes a plurality of first nano metal wires. The second lattice pattern is disposed on the first dielectric layer at a second color pixel region. The second lattice pattern includes a plurality of second nano metal wires. The second nano metal wires have different dimensions from the first nano metal wires. The second dielectric layer covers the first nano metal wires and the second nano metal wires.

11 Claims, 19 Drawing Sheets

DISPLAY SUBSTRATE, METHOD OF MANUFACTURING THE DISPLAY SUBSTRATE, AND DISPLAY DEVICE HAVING THE DISPLAY SUBSTRATE

PRIORITY STATEMENT

This application claims priority under 35 U.S.C. §119 to Korean Patent Application No. 2009-0094488, filed on Oct. 6, 2009 in the Korean Intellectual Property Office (KIPO), the contents of which are herein incorporated by reference in their entirety.

BACKGROUND OF THE INVENTION

1. Field of the Invention

The present invention relates to a display substrate, a method of manufacturing the display substrate, and a display device having the display substrate. More particularly, the present invention relates to a display substrate used in a liquid crystal display (LCD) device, a method of manufacturing the display substrate, and a display device having the display substrate.

2. Description of the Related Art

A liquid crystal display (LCD) device offers many desirable qualities such as thinness and light weight compared to a conventional cathode ray tube (CRT) display device, and is thus increasingly widely used. An LCD device includes an LCD panel, which displays an image by using light transmission through liquid crystal molecules. A conventional LCD panel includes a lower substrate, an upper substrate, and a liquid crystal layer interposed between the lower substrate and the upper substrate. A switching element and a pixel electrode are formed on the lower substrate. A color filter and a common electrode are formed on the upper substrate.

Since the LCD panel is not self-emissive, the LCD device often includes a backlight unit to provide light.

However, the light emitted from the backlight unit passes via various elements such as a polarization plate disposed outside the LCD panel, signal lines, a color filter, a liquid crystal layer, etc., such that a considerable amount of the light is dispersed, absorbed, or reflected. Therefore, optical efficiency of light emitted from the backlight unit may be considerably reduced.

SUMMARY OF THE INVENTION

In one aspect, the present invention provides a display device for simplifying a structure to improve optical efficiency.

In another aspect, the present invention provides a method of manufacturing the display substrate.

The present invention also provides a display device having the display substrate.

In accordance with one aspect of the present invention, a display substrate includes a base substrate, a first dielectric layer, a first lattice pattern, a second lattice pattern, and a second dielectric layer. The first dielectric layer is disposed on the base substrate. The first lattice pattern is disposed on the first dielectric layer at a first color pixel region. The first lattice pattern includes a plurality of first nano metal wires. The second lattice pattern is disposed on the first dielectric layer at a second color pixel region. The second lattice pattern includes a plurality of second nano metal wires. The second nano metal wires have different dimensions from the first nano metal wires. The second dielectric layer is disposed on the first lattice pattern and the second lattice pattern. The second dielectric layer covers the first nano metal wires and the second nano metal wires.

Each of the first nano metal wire and the second nano metal wire may include a main wire including a first metal, and a sub wire disposed adjacent to the main wire. The sub wire contains a second metal different from the first metal. The sub wire has different dimensions from the main wire.

The first dielectric layer and the second dielectric layer may include the same dielectric material.

The display device may further include a thin-film transistor and a pixel electrode disposed on the second dielectric layer. The thin-film transistor includes a gate electrode connected to a gate line, a source electrode connected to a data line, and a drain electrode separated from the source electrode. The pixel electrode is electrically connected to the thin-film transistor.

At least one of a width, a thickness, and an arranging period of the second nano metal wires may be different from that of the first nano metal wires.

The display device may further include a thin-film transistor including a gate electrode connected to a gate line, a source electrode connected to a data line, and a drain electrode separated from the source electrode. The first dielectric layer is formed on the base substrate on which the data line, the source electrode and the drain electrode are formed. A first pixel voltage and a common voltage are applied to adjacent first nano metal wires, respectively. A second pixel voltage and the common voltage are applied to adjacent second nano metal wires, respectively.

The display device may further include a light-blocking layer disposed at a boundary between the first pixel region and the second pixel region, and a common electrode disposed on the light-blocking layer. The first dielectric layer is formed on the light-blocking layer to cover the light-blocking layer, and the common electrode is disposed on the second dielectric layer.

In accordance with another aspect of the present invention, there is provided a method of manufacturing a display substrate. In the method, a first dielectric layer is formed on a base substrate. A first lattice pattern and a second lattice pattern are formed on the first dielectric layer. The first lattice pattern is disposed at a first color pixel region on the base substrate and includes a plurality of first nano metal wires. The second lattice pattern is disposed at a second color pixel region on the base substrate. The second lattice pattern includes a plurality of second nano metal wires. The second nano metal wires have different dimensions from the first nano metal wires. A second dielectric layer is formed. The second dielectric layer covers the first nano metal wires and the second nano metal wires.

When the first lattice pattern and the second lattice pattern are formed, a first main wire of one of the first nano metal wires and a second main wire of one of the second nano metal wires may be formed with a first metal. A first sub wire and a second sub wire may be formed with a second metal. The first sub wire makes contact with the first main wire, and the second sub wire makes contact with the second main wire.

A gate metal pattern may be further formed on the second dielectric layer. The gate metal pattern includes a gate line and a gate electrode. A data metal pattern insulated from the gate metal pattern may be further formed. The data metal pattern includes a data line, a source electrode connected to the data line, and a drain electrode separated from the source electrode. A pixel electrode electrically connected to the drain electrode may be further formed.

A gate metal pattern may be further formed on the base substrate. The gate metal pattern may include a gate line and a gate electrode. A data metal pattern insulated from the gate metal pattern may be further formed. The data metal pattern includes a data line, a source electrode connected to the data line, and a drain electrode separated from the source electrode. The first dielectric layer is formed to cover the data metal pattern.

Prior to forming the first dielectric layer, a light-blocking layer may be further formed at a boundary between the first pixel region and the second pixel region on the base substrate. A common electrode may be further formed on the second dielectric layer.

In accordance with further another aspect of the present invention, a display device includes a first display substrate and a second display substrate. The first display substrate includes a base substrate, a first dielectric layer, a first lattice pattern, a second lattice pattern, and a second dielectric layer. The first dielectric layer is disposed on the base substrate. The first lattice pattern is disposed on the first dielectric layer at a first color pixel region. The first lattice pattern includes a plurality of first nano metal wires. The second lattice pattern is disposed on the first dielectric layer at a second color pixel region. The second lattice pattern includes a plurality of second nano metal wires. The second nano metal wires have different dimensions from the first nano metal wires. The second dielectric layer is disposed on the first lattice pattern and the second lattice pattern. The second dielectric layer covers the first nano metal wires and the second nano metal wires. The second display substrate includes a second base substrate facing the first base substrate and a common electrode disposed on the second base substrate.

Each of the first nano metal wires and the second nano metal wires may include a main wire comprising a first metal, and a sub wire disposed adjacent to the main wire. The sub wire contains a second metal different from the first metal. The sub wire has different dimensions from the main wire.

In one example embodiment of the present invention, at least one of a width, a thickness, and an arranging period of the second nano metal wires may be different from that of the first nano metal wires.

In accordance with still further another aspect of the present invention, a display device includes a first display substrate and a second display substrate facing the first display substrate. The first display substrate includes a pixel electrode disposed on a first base substrate. The second display substrate includes a second base substrate, a first dielectric layer, a first lattice pattern, a second lattice pattern, a second dielectric layer, and a common electrode. The second base substrate defines a first color pixel region and a second color pixel region. The first dielectric layer is disposed on the second base substrate. The first lattice pattern is disposed on the first dielectric layer at the first color pixel region. The first lattice pattern includes a plurality of first nano metal wires. The second lattice pattern is disposed on the first dielectric layer at the second color pixel region. The second lattice pattern includes a plurality of second nano metal wires. A size of the second nano metal wire is different from that of the first nano metal wire. The second dielectric layer is disposed on the first lattice pattern and the second lattice pattern. The second dielectric layer covers the first nano metal wires and the second nano metal wires. The common electrode is disposed on the second dielectric layer.

Each of the first nano metal wires and the second nano metal wires may include a main wire containing a first metal, and a sub wire disposed adjacent to the main wire. For example, the sub wire may be disposed at both sides of the main wire. The sub wire contains a second metal different from the first metal. The sub wire has different dimensions (e.g., a different width) from that of the main wire.

In one example embodiment of the present invention, at least one of a width, a thickness, and an arranging period of the second nano metal wire may be different from that of the first nano metal wire.

In accordance with still further another aspect of the present invention, a display device includes a first display substrate and a second display substrate. The first display substrate includes a thin-film transistor formed on a first base substrate, a first dielectric layer, a first lattice pattern, a second lattice pattern, and a second dielectric layer. The first base substrate defines a first color pixel region and a second color pixel region. The first dielectric layer is disposed on the base substrate. The first dielectric layer covers the thin-film transistor. The first lattice pattern is disposed on the first dielectric layer at the first color pixel region. The first lattice pattern includes a plurality of first nano metal wires. The second lattice pattern is disposed on the first dielectric layer at the second color pixel region. The second lattice pattern includes a plurality of second nano metal wires. The second nano metal wires have different dimensions from the first nano metal wires. The second dielectric layer is disposed on the first lattice pattern and the second lattice pattern. The second dielectric layer covers the first nano metal wires and the second nano metal wires. The second display substrate includes a second base substrate facing the first base substrate.

A first pixel voltage and a common voltage may be applied to adjacent first nano metal wires, respectively. A second pixel voltage and the common voltage may be applied to adjacent second nano metal wires, respectively.

According to some example embodiments of the present invention, a combination of the first, second and third nano metal wires, and the first and second dielectric layers may generate surface plasmon resonance and induce polarized color light. Therefore, a conventional color filter and a conventional lower polarization plate may be omitted, so that a cost of manufacturing a display device may be reduced. Furthermore, the simplified structure may shorten a pathway of light and reduce a loss of the light, so that optical efficiency may be improved.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

Figure 1:
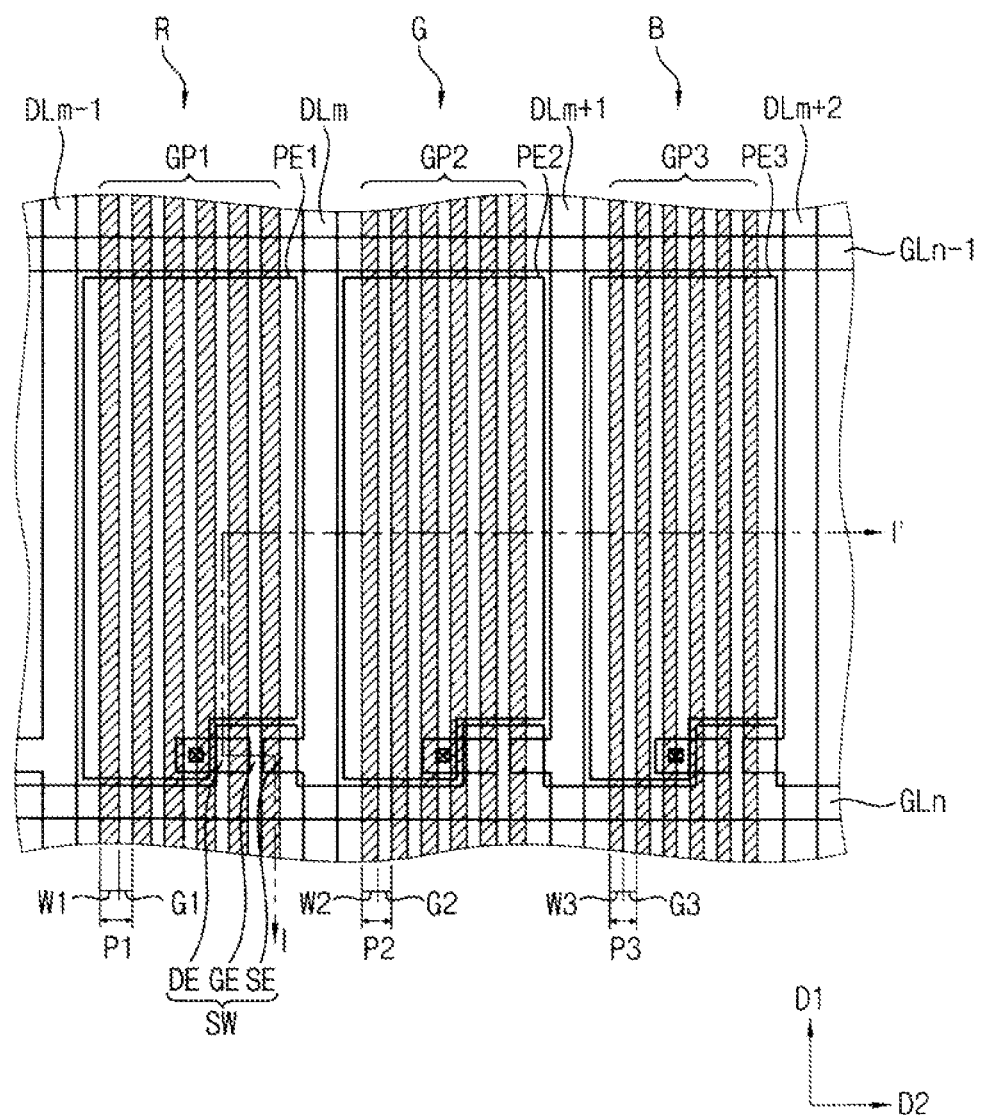
FIG. 1 is a plan view illustrating a display device in accordance with Exemplary Embodiment 1 of the present invention.

The present invention is described more fully hereinafter with reference to the accompanying drawings, in which example embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprising," "having," "including," and/or "containing," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include variations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Exemplary Embodiment 1

Figure 2:
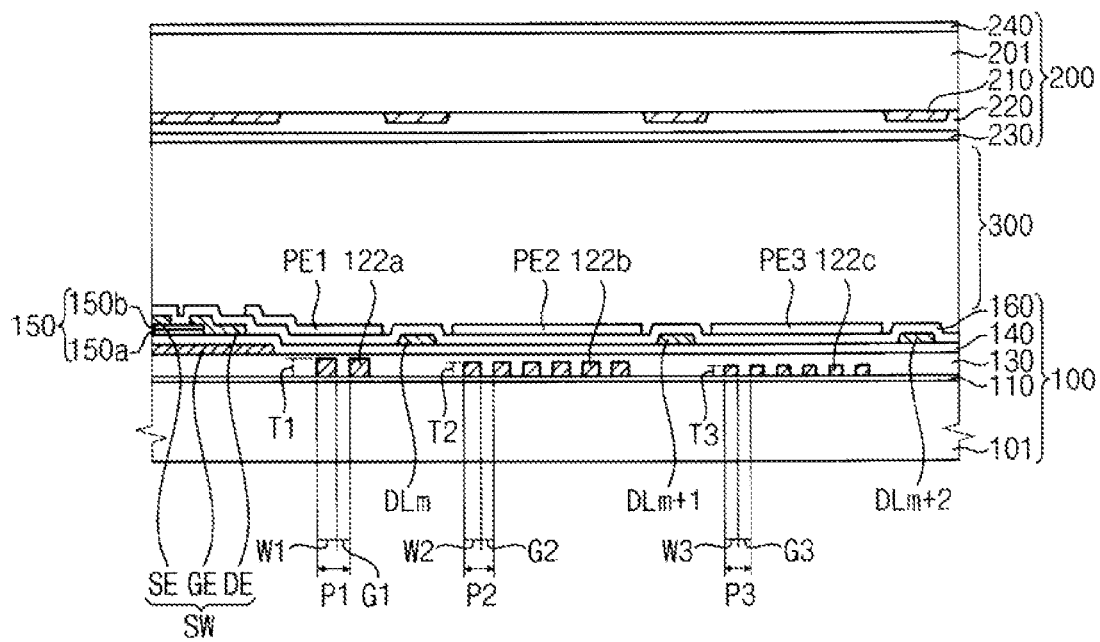
FIG. 2 is a cross-sectional view taken along I-I' in FIG. 1.

FIG. 1 is a plan view illustrating a display device in accordance with Exemplary Embodiment 1 of the present invention. FIG. 2 is a cross-sectional view taken along I-I' in FIG. 1.

Referring to FIGS. 1 and 2, a display device in accordance with Exemplary Embodiment 1 of the present invention includes a first display substrate 100, a second display substrate 200 facing the first display substrate 100, and a liquid crystal layer 300 interposed between the first display substrate 100 and the second display substrate 200.

The first display substrate 100 includes a first base substrate 101. The first base substrate 101 may include glass. The first base substrate 101 includes a first color pixel region R, a second color pixel region G, and a third color pixel region B. The pixel regions may be adjacently arranged.

A first dielectric layer 110, a first lattice pattern GP1, a second lattice pattern GP2, a third lattice pattern GP3, and a second dielectric layer 130 may be formed on the first base substrate 101.

In one exemplary embodiment, the first dielectric layer 110 may be formed on a whole surface of the first base substrate 101. The first dielectric layer 110 may contain a dielectric material such as silicon oxide ($SiO_2$).

The first lattice pattern GP1 is disposed at the first color pixel region R on the first base substrate 101 on which the first dielectric layer 110 is formed. The first lattice pattern GP1 includes a plurality of first nano metal wires 122a. Each of the first nano metal wires 122a may have substantially the same size as the others. The first nano metal wires 122a may have a first width W1 and a first thickness T1. The first nano metal wires 122a extend in a first direction D1. The first nano metal wires 122a may be formed every first distance P1 along a second direction D2 different from the first direction D1. In other words, an arranging period of the first nano metal wires 122a is the first distance P1. Neighboring first nano metal wires 122a may be separated from each other by a first gap G1 along the second direction D2.

The second lattice pattern GP2 is disposed at the second color pixel region G adjacent to the first color pixel region R on the first base substrate 101. The second lattice pattern GP2 includes a plurality of second nano metal wires 122b. The second nano metal wires 122b have different dimensions from the first nano metal wires 122a. Each of the second nano metal wires 122b may have substantially the same size as the others, for example having a second width W2 and a second thickness T2. The second nano metal wires 122b extend in the first direction D1. The second nano metal wires 122b may be formed every second distance P2 along the second direction D2. In other words, an arranging period of the second nano metal wires 122b is the second distance P2. Neighboring second nano metal wires 122b may be separated from each other by a second gap G2 along the second direction D2. The second width W2 may be different from the first width W1. The second thickness T2 is different from the first thickness T1. For example, the second thickness T2 may be thinner than the first thickness T1.

The third lattice pattern GP3 is disposed at the third color pixel region B adjacent to the second color pixel region G on the first base substrate 101. The third lattice pattern GP3 includes a plurality of third nano metal wires 122c. The third nano metal wires 122c have different dimensions from the second nano metal wires 122b and the first nano metal wires 122a. Each of the third nano metal wires 122b may have substantially the same size as the others, for example having a third width W3 and a third thickness T3. The third nano metal wires 122c extend in the first direction D1. The third nano metal wires 122c may be formed every third distance P3 along the second direction D2. In other words, an arranging period of the third nano metal wires 122c is the third distance P3. Neighboring third nano metal wires 122c may be separated from each other by a third gap G3 in the second direction D2. The third width W3 may be different from the second width W2. The third thickness T3 may be different from the second thickness T2. The third gap G3 may be different from the second gap G2.

The first, second and third nano metal wires 122a, 122b and 122c may be formed as stripe type, circular type, or spiral type wires, among other possibilities. The first, second and third nano metal wires 122a, 122b and 122c may contain a metal such as silver (Ag), gold (Au), aluminum (Al), etc.

The second dielectric layer 130 is formed on the first, second and third lattice patterns GP1, GP2 and GP3. The second dielectric layer 130 covers the first, second and third nano metal wires 122a, 122b and 122c, and covers the gaps G1, G2 and G3 between adjacent nano metal wires of the first, second and third nano metal wires 122a, 122b and 122c. The second dielectric layer 130 may be substantially the same dielectric material as the first dielectric layer 110.

The first dielectric layer 110, the second dielectric layer 130, and the first, second and third nano metal wires 122a, 122b and 122c may function as a color filter. That is, physical and dielectric characteristics of the metal of the first, second and third nano metal wires 122a, 122b and 122c, and dielectric characteristics of the dielectric material of the first and second dielectric layer 110 and 130 may produce light of a predetermined wavelength range.

For example, when the first dielectric layer 110 is irradiated, surface plasmon resonance is generated among the first dielectric layer 110, the second dielectric layer 130, and the first, second and third nano metal wires 122a, 122b and 122c, and the incident light is transformed by the resonance to light of a predetermined wavelength range. The surface plasmon resonance represents an electromagnetic phenomenon caused by an evanescent wave that generates oscillation of electron density proceeding along an interface between a metal and a dielectric. Exemplary embodiments of the present invention use the surface plasmon resonance to produce light of a predetermined wavelength range. More specifically, the first nano metal wires 122a may have dimensions capable of producing a first color, and the second nano metal wires 122b may have dimensions capable of producing a second color. The third nano metal wires 122c may have dimensions capable of producing a third color. Here, the first, second and third colors may be red, green and blue, respectively.

in an exemplary embodiment, the thickness T1 of the first nano metal wires 122a may be about 125 nm. The first nano metal wires 122a may be periodically formed at a period P1 of about 300 nm. The gap G1 between the adjacent first nano metal wires 122a may be about 50 nm. The width W1 of the first nano metal wires 122a may be about 250 nm. Thickness T2 of the second nano metal wires 122b may be about 100 nm. The second nano metal wires 122b may be periodically formed at a period P2 of about 250 nm. The gap G2 between the adjacent second nano metal wires 122b may be about 60 nm. The width W2 of the second nano metal wires 122b may be about 190 nm. The thickness T3 of the third nano metal wires 122c may be about 75 nm. The third nano metal wires 122c may be formed at a period P3 of about 230 nm. The gap G3 between the adjacent third nano metal wires 122c may be about 60 nm. The width W3 of the third nano metal wires 122c may be about 170 nm. The above numerical values are examples when the first, second and third nano metal wires 122a, 122b and 122c contain aluminum (Al) and the first and second dielectric layers 110 and 130 contain silicon oxide ($SiO_2$).

The physical and dielectric characteristics of the metal of the first, second and third nano metal wires 122a, 122b and 122c, and the dielectric characteristics of the dielectric material of the first and second dielectric layers 110 and 130 act as important factors for producing lights of a predetermined wavelength range (i.e., color). The size of the first, second and third nano metal wires 122a, 122b and 122c may vary according to the kind of the metal that is used for forming the first, second and third nano metal wires 122a, 122b and 122c, and the kind of the dielectric material that is used for forming the first and second dielectric layers 110 and 130.

Furthermore, the first, second and third nano metal wires 122a, 122b and 122c may function as a polarization layer. The first, second and third nano metal wires 122a, 122b and 122c may reflect and polarize light passing through the first base substrate 101. The first, second and third nano metal wires 122a, 122b and 122c may function as a linear polarization layer or a circular polarization layer according to the type of material or their shapes. For example, the first, second and third nano metal wires 122a, 122b and 122c may function as a linear polarization layer that selectively transmits linearly polarized light when the first, second and third nano metal wires 122a, 122b and 122c are formed as stripes. Alternatively, the first, second and third nano metal wires 122a, 122b and 122c may function as a circular polarization layer that selectively transmits circularly polarized light, when the first, second and third nano metal wires 122a, 122b and 122c are formed as a circular type or a spiral type.

A plurality of gate lines GLn−1 and GLn, a gate insulation layer 140, a plurality of data lines DLm−1, DLm, DLm+1 and DLm+2, and a plurality of thin-film transistors SW are formed on the first base substrate 101 on which the second dielectric layer 130 is formed.

The gate insulation layer 140 is formed on the first base substrate 101 on which a gate electrode GE and the gate lines GLn−1 and GLn are formed. The gate lines GLn−1 and GLn may extend in the second direction D2 on the second dielectric layer 130.

The data lines DLm−1, DLm, DLm+1 and DLm+2 may extend in the first direction D1 on the gate insulation layer 140.

The thin-film transistor SW may include the gate electrode GE electrically connected to the gate lines GLn−1 and GLn, a source electrode SE electrically connected to the data lines DLm−1, DLm, DLm+1 and DLm+2, a drain electrode DE separated from the source electrode SE, and an active pattern 150 formed on the gate insulation layer 140. The active pattern 150 includes a semiconductor layer 150a and an ohmic contact layer 150b formed on the semiconductor layer 150a.

A passivation layer 160 and a plurality of pixel electrodes PE1, PE2 and PE3 are formed on the first base substrate 101 on which the thin-film transistor SW is formed.

The passivation layer 160 is formed on the gate insulation layer 140, and covers the data lines DLm−1, DLm, DLm+1 and DLm+2, the source electrode SE and the drain electrode DE.

The pixel electrodes PE1, PE2 and PE3 contain a transparent conductive material. The pixel electrodes PE1, PE2 and PE3 are formed on the passivation layer 160 in each of the first, second and third color pixel regions R, G and B. The pixel electrodes PE1, PE2 and PE3 are electrically connected to the drain electrode DE through a contact hole in the passivation layer 160 that extends to a portion of the drain electrode DE.

The second display substrate 200 may include a second base substrate 201, a light-blocking layer 210, an overcoat layer 220, a common electrode 230 and an upper polarization plate 240.

The light-blocking layer 210 may be formed at a boundary between two regions of the adjacent color pixel regions R, G and B.

The overcoat layer 220 is formed on the second base substrate 201 on which the light-blocking layer 210 is formed.

The common electrode 230 contains a transparent conductive material. The common electrode 230 is formed on the second base substrate 201 on which the overcoat layer 220 is formed. The common electrode 230 faces the pixel electrodes PE1, PE2 and PE3. The common electrode 230 may be formed on a whole surface of the second base substrate 201.

The light-blocking layer 210 may be formed on a first surface of the second base substrate 201, and the upper polarization layer 240 may be on a second surface of the second base substrate 201 that is opposite to the first surface of the second display substrate 200.

Figure 3A:
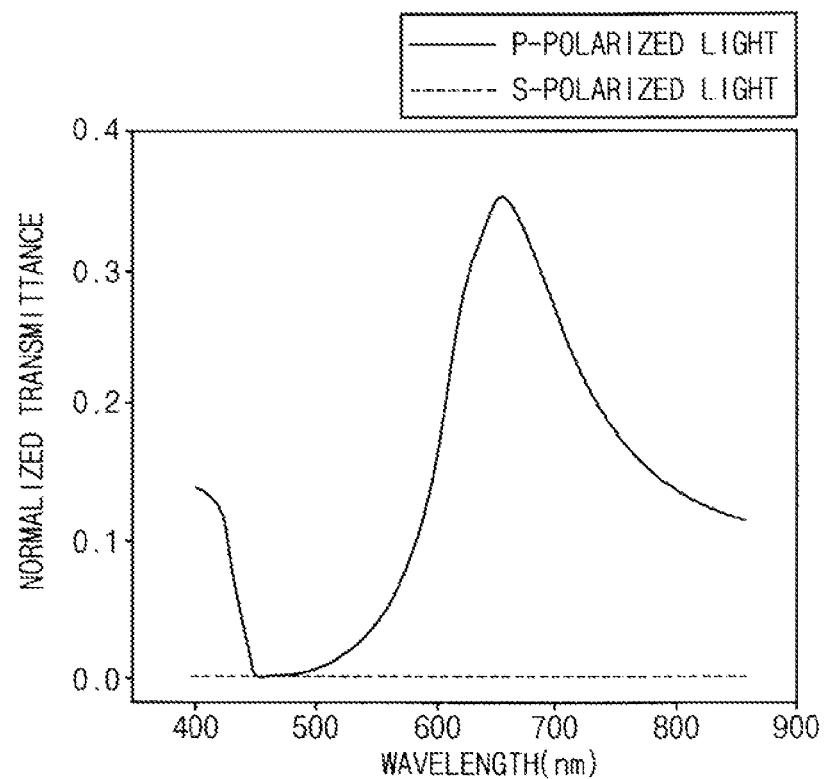
FIG. 3A and FIG. 3B are graphs for describing optical transmittance and polarization efficiency of incident light according to wavelength using the first nano metal wires in FIG. 1.
Figure 3B:
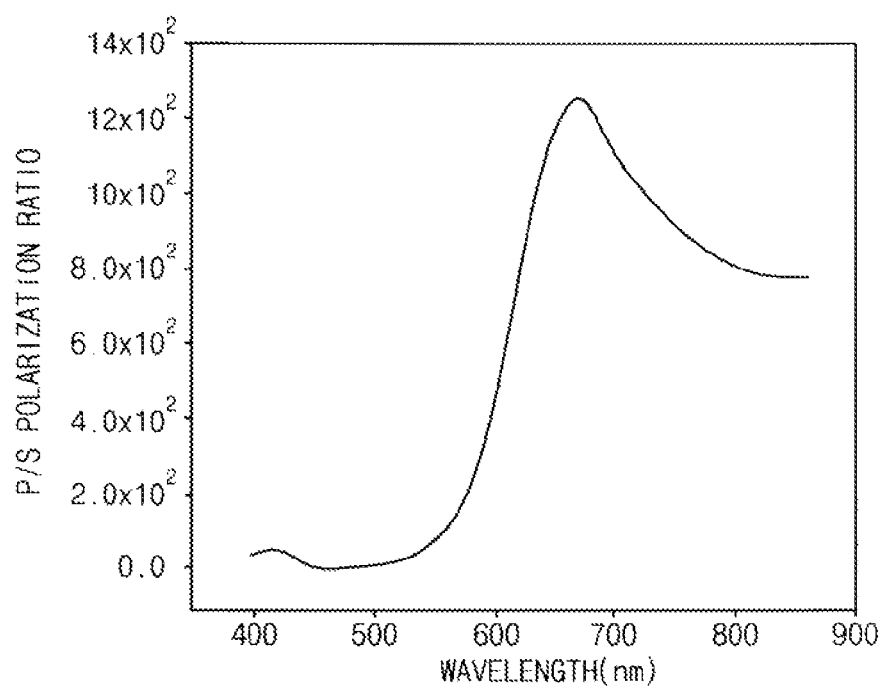

FIG. 3A and FIG. 3B are graphs for describing optical transmittance and polarization efficiency of incident light according to wavelength. The size of the first nano metal wires is substantially the same as in the embodiment of FIG. 1.

The graphs in FIG. 3A and FIG. 3B show results of simulation for measuring the optical transmittance and polarization efficiency. In one simulation, the thickness T1 of the first nano metal wires 122a in FIG. 1 was about 125 nm, and the first nano metal wires were formed at a period P1 of about 300 nm and at a gap G1 of about 50 nm between the adjacent first nano metal wires. Further, the first and second dielectric layers contained silicon oxide ($SiO_2$), and the first nano metal wires contained aluminum (Al). The first lattice pattern including the first nano metal wires was configured to transmit a P-polarized component and reflect an S-polarized component.

Referring to FIG. 3A and FIG. 3B, optical transmittance and polarization efficiency of the P-polarized component of the incident light were the highest at a wavelength of about 650 nm (i.e., a wavelength of red light). That is, when the first and second dielectric layers and the first nano metal wires meet the above conditions, the first and second dielectric layers and the first nano metal wires may bring out P-polarized red color light.

Figure 4A:
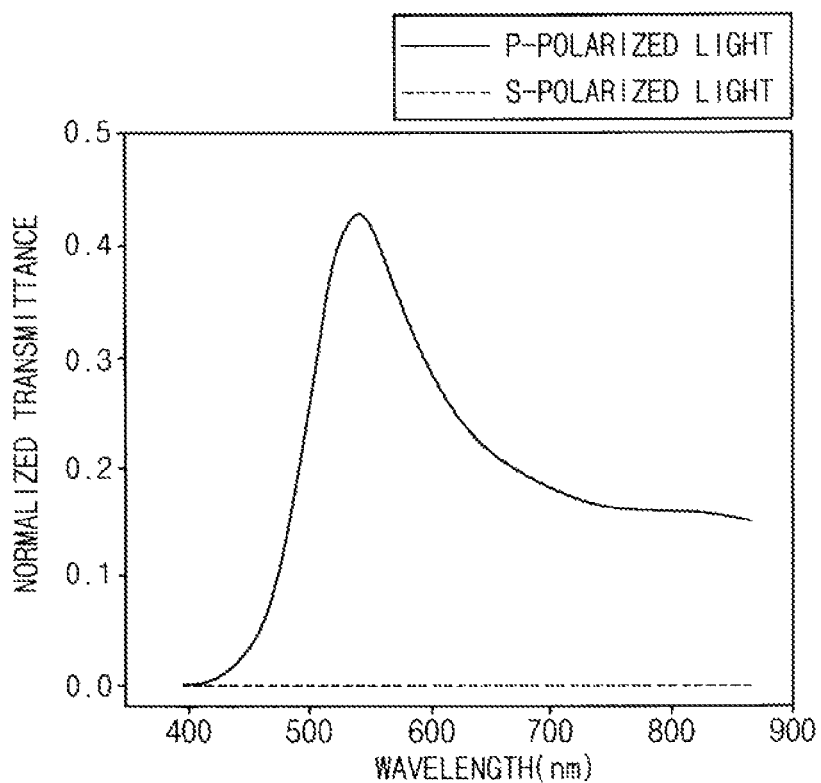
FIG. 4A and FIG. 4B are graphs for describing optical transmittance and polarization efficiency of incident light according to wavelength using the second nano metal wires in FIG. 1.
Figure 4B:
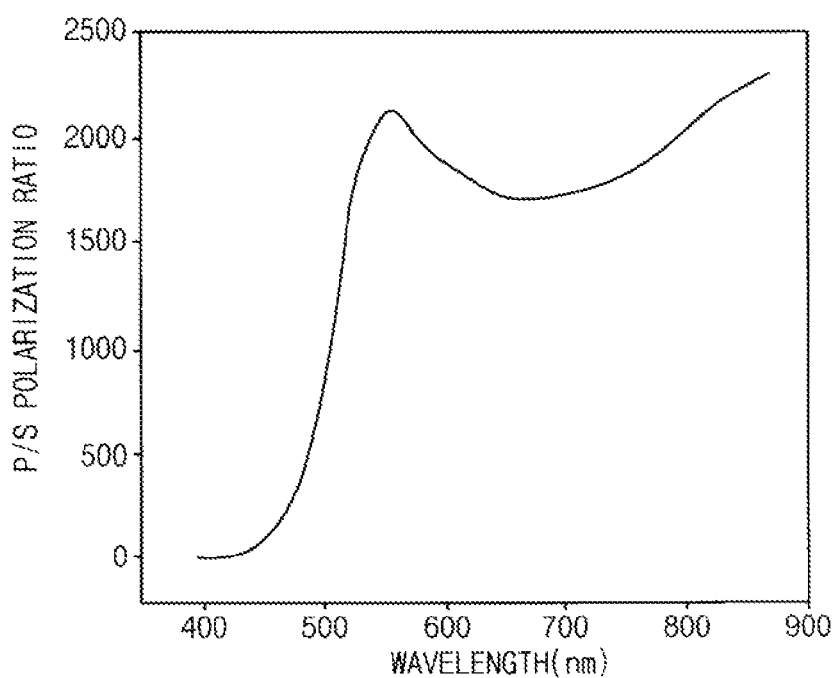

FIG. 4A and FIG. 4B are graphs for describing optical transmittance and polarization efficiency of incident light according to wavelength. The size of the second nano metal wires used were about the same as in the embodiment of FIG. 1.

The graphs in FIG. 4A and FIG. 4B show results of simulation for measuring the optical transmittance and polarization efficiency. In one simulation, the thickness T2 of the second nano metal wires 122b in FIG. 1 was about 100 nm, and the second nano metal wires were formed at a period P2 of about 250 nm and at a gap of about 60 nm between the adjacent second nano metal wires. Further, the first and second dielectric layers contained silicon oxide ($SiO_2$), and the second nano metal wires contained aluminum (Al). The second lattice pattern including the second nano metal wires was configured to transmit a P-polarized component and reflect an S-polarized component.

Referring to FIG. 4A and FIG. 4B, optical transmittance and polarization efficiency of the P-polarized component of the incident light were the highest at a wavelength of about 550 nm (i.e., a wavelength of green light). That is, when the first and second dielectric layers and the second nano metal wires meet the above conditions, the first and second dielectric layers and the second nano metal wires may induce P-polarized green light.

Figure 5A:
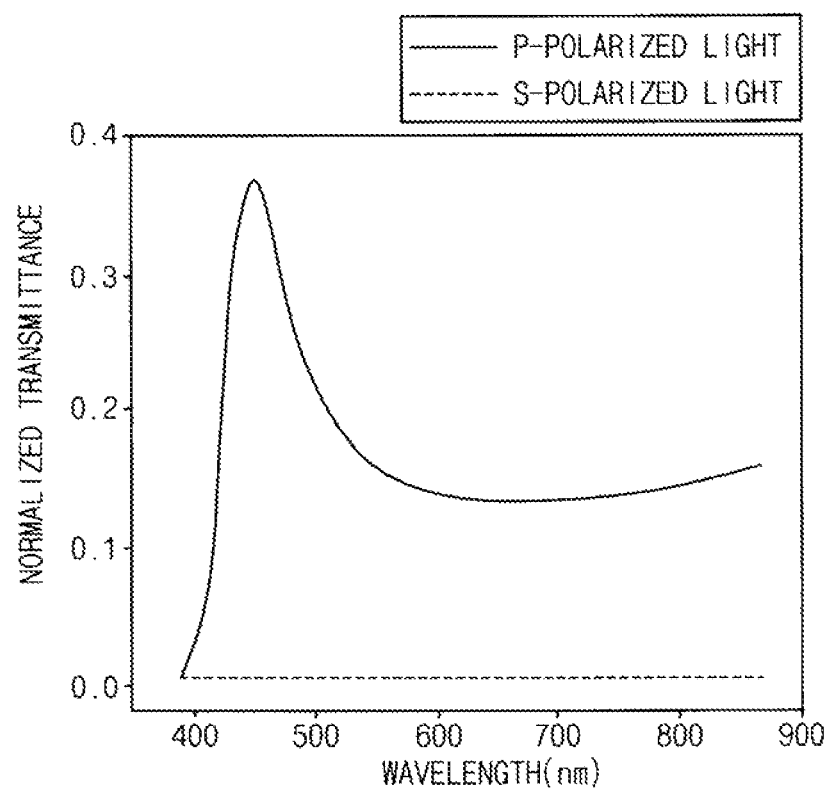
FIG. 5A and FIG. 5B are graphs for describing optical transmittance and polarization efficiency of incident light according to wavelength using the third nano metal wires in FIG. 1.
Figure 5B:
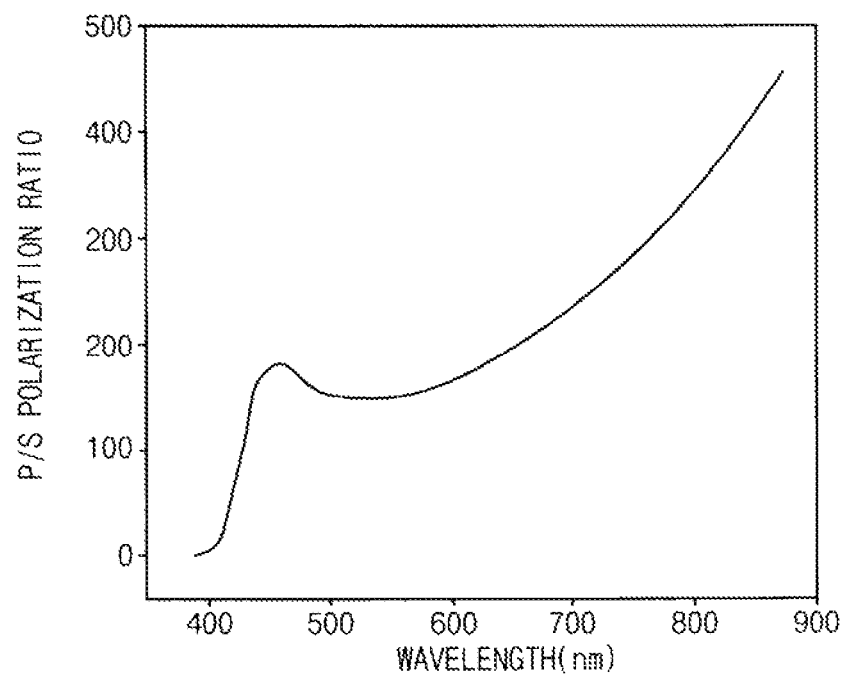

FIG. 5A and FIG. 5B are graphs for describing optical transmittance and polarization efficiency of incident light according to wavelength. The size of the third nano metal wires used is about the same as in the embodiment of FIG. 1.

The graphs in FIG. 5A and FIG. 5B show results of simulation for measuring the optical transmission and polarization efficiency. In one simulation, the thickness T3 of the third nano metal wires 122c in FIG. 1 was about 75 nm, and the third nano metal wires were formed at a period P3 of about 230 nm and at a gap G3 of about 60 nm between the adjacent third nano metal wires. Further, the first and second dielectric layers contained silicon oxide ($SiO_2$), and the third nano metal wires contained aluminum (Al). The third lattice pattern including the third nano metal wires was configured to transmit a P-polarized component and reflect an S-polarized component.

Referring to FIG. 5A and FIG. 5B, optical transmittance of the P-polarized component of the incident light was the highest at a wavelength of about 450 nm (i.e., a wavelength of blue light). However, polarization efficiency at the wavelength of blue light was relatively low. Nevertheless, the first and second dielectric layers and the third nano metal wires may induce P-polarized blue color light when the first and second dielectric layers and the third nano metal wires meet the above conditions.

FIGS. 6A to 6D are cross-sectional views illustrating exemplary processes of manufacturing the first display substrate illustrated in FIG. 2.

Figure 6A:
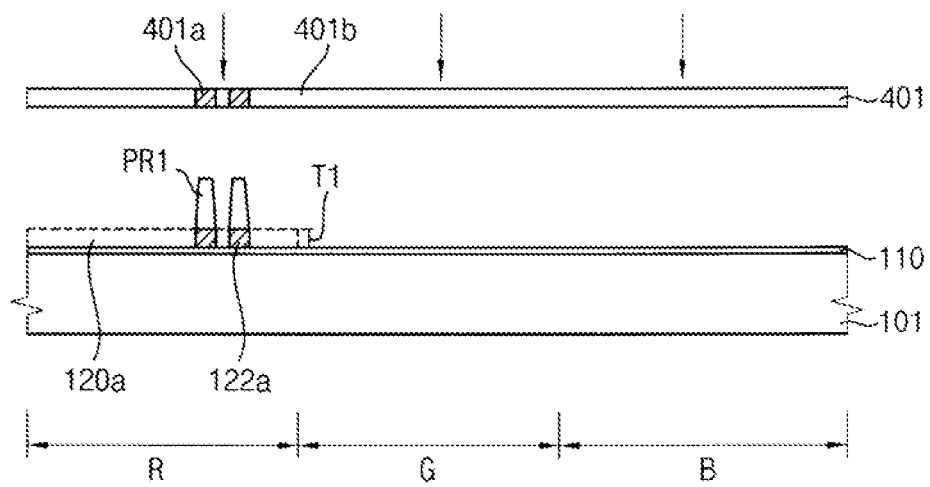
FIGS. 6A to 6D are cross-sectional views illustrating exemplary processes of manufacturing the first display substrate illustrated in FIG. 2.

Referring to FIG. 2 and FIG. 6A, the first dielectric layer 110 may be formed on a whole surface of the first base substrate 101. A first metal layer 120a having a first thickness T1 is formed at a first color pixel region R on the first base substrate 101 including the first dielectric layer 110. Although not illustrated in FIG. 6A, a mask may be used to form the first metal layer 120a only at the first color pixel region R. A first photoresist layer is formed on the first base substrate 101 including the first metal layer 120a. For example, a portion of the first photoresist layer exposed to light may be removed by a developer, and an unexposed portion of the first photoresist layer may remain on the first base substrate 101. That is, the first photoresist layer may contain a positive photoresist composition.

A first mask 401 having a plurality of first shading portions 401a and a plurality of first transparent portions 401b is disposed over the first base substrate 101 on which the first photoresist layer is formed. The first shading portions 401a are disposed at regions corresponding to the regions where the first nano metal wires 122a are to be formed. The first transparent portions 401b are disposed at a region corresponding to the region where the thin-film transistor SW, the data lines DLm−1, DLm, DLm+1 and DLm+2, and the first, second and third gaps G1, G2 and G3 are to be formed. The first photoresist layer is irradiated.

The first photoresist layer exposed to light is developed to form a first photoresist pattern PR1 at the region where the first nano metal wires 122a are to be formed. That is, the unexposed portion of the first photoresist layer remains and forms the first photoresist pattern PR1. The portion of the first photoresist layer exposed to light is removed to expose a portion of the first metal layer 120a. The first metal layer 120a is patterned by using the first photoresist pattern PR1 to form the first nano metal wires 122a at the first color pixel region R.

Figure 6B:
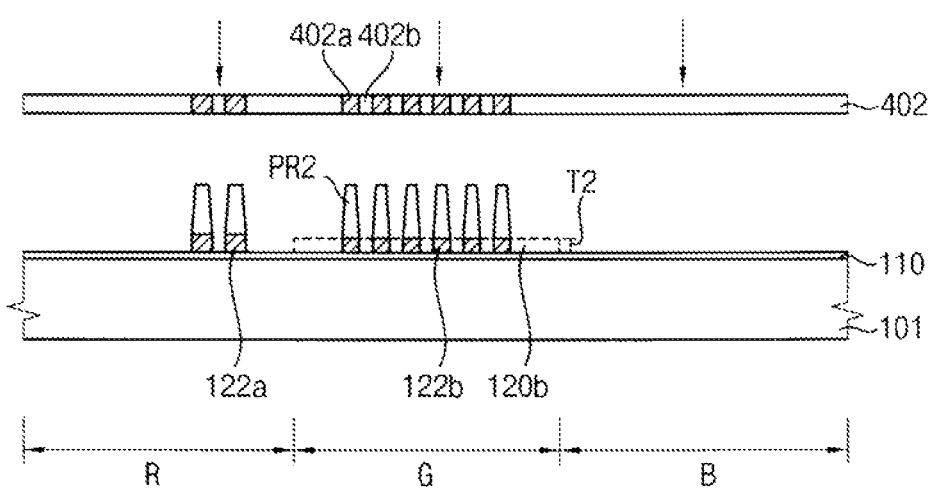

Referring to FIG. 6B, a second metal layer 120b having a second thickness T2 different from the first thickness T1 is formed at a second color pixel region G on the first base substrate 101 including the first nano metal wires 122a. The second thickness T2 may be thinner than the first thickness T1. Although not illustrated in FIG. 6B, a mask may be used to form the second metal layer 120b only at the second color pixel region G. A second photoresist layer is formed on the first base substrate 101 including the second metal layer 120b.

The second photoresist layer is patterned by using a second mask 402 having a plurality of second shading portions 402a and a plurality of second transparent portions 402b to form a second photoresist pattern PR2 at regions where the second nano metal wires 122b are to be formed. For example, a portion of the second photoresist layer that is not exposed to light remains and forms the second photoresist pattern PR2. The portion of the second photoresist layer exposed to light is removed to expose a portion of the second metal layer 120b. The second metal layer 120b is patterned by using the second photoresist pattern PR2 to form the second nano metal wires 122b at the second color pixel region G.

Figure 6C:
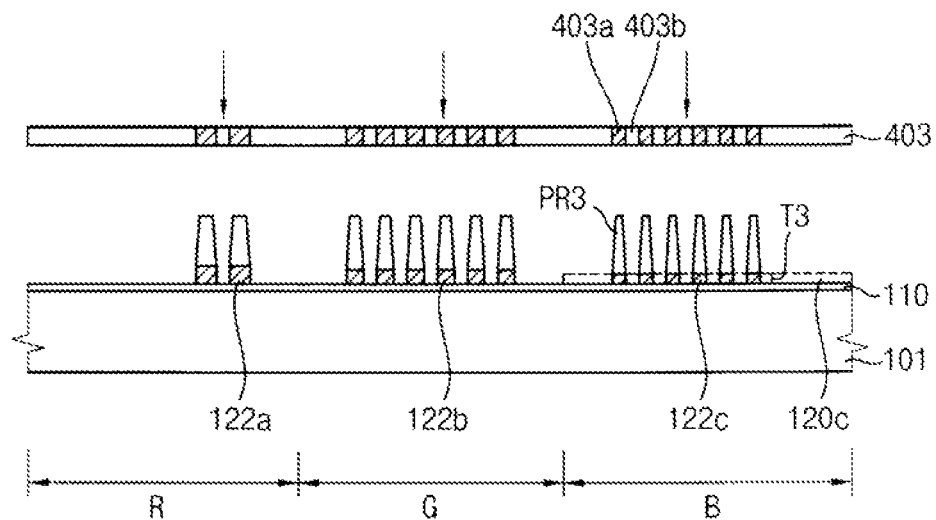

Referring to FIG. 6C, a third metal layer 120c having a third thickness T3 different from the second thickness T2 and the first thickness T1 is formed at a third color pixel region B on the first base substrate 101 including the first nano metal wires 122a and the second nano metal wires 122b. The third thickness T3 may be thinner than the second thickness T2. Although not illustrated in FIG. 6C, a mask may be used to form the third metal layer 120c only at the third color pixel region B. A third photoresist layer is formed on the first base substrate 101 including the third metal layer 120c.

The third photoresist layer is patterned by using a third mask 403 having a plurality of third shading portions 403a and a plurality of third transparent portions 403b to form a third photoresist pattern PR3 at regions where the third nano metal wires 122c are to be formed. The third metal layer 120c is patterned by using the third photoresist pattern PR3 to form the third nano metal wires 122c at the third color pixel region B.

Figure 6D:
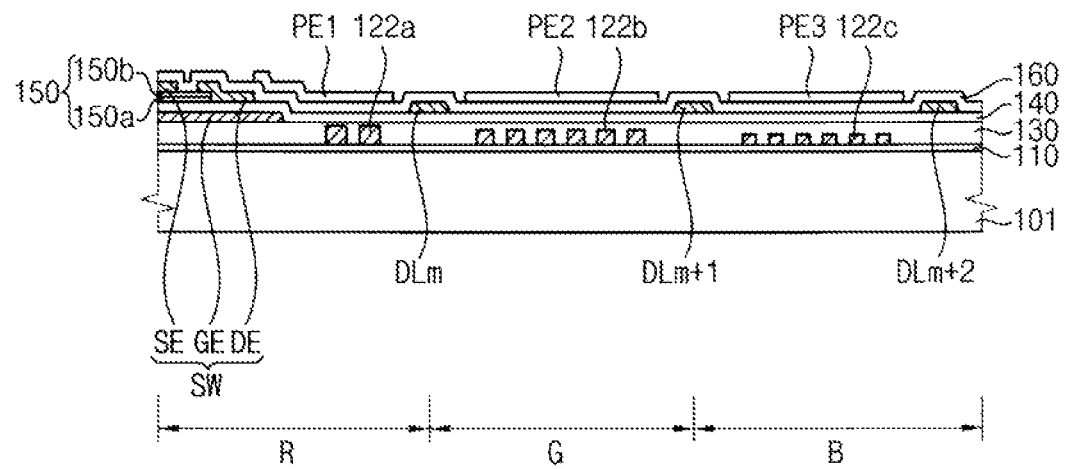

Referring to FIG. 6D, the second dielectric layer 130 is formed on the first base substrate 101 on which the first, second and third nano metal wires 122a, 122b and 122c are formed. A gate metal layer is formed on the first base substrate 101 on which the second dielectric layer 130 was formed. The gate metal layer is patterned to form a gate metal pattern including the gate electrode GE and the gate lines GLn−1 and GLn. The gate insulation layer 140 is formed on the first base substrate 101 on which the gate metal pattern is formed.

The active pattern 150 is formed on the first base substrate 101 on which the gate insulation layer 140 is formed. A data metal layer is formed on the first base substrate 101 on which the active pattern 150 is formed. The data metal layer is patterned to form a data metal pattern including the source electrode SE, the drain electrode DE and the data lines DLm−1, DLm, DLm+1 and DLm+2.

A passivation layer 160 is formed on the first base substrate 101 on which the data metal pattern is formed. A transparent conductive layer is formed on the first base substrate 101 on which the passivation layer 160 is formed. The transparent conductive layer is patterned to form the pixel electrodes PE1, PE2 and PE3.

According to Exemplary Embodiment 1 of the present invention, a contact between the first, second and third nano metal wires 122a, 122b and 122c, and the first and second dielectric layers 110 and 130 may generate surface plasmon resonance and produce polarized colored light. Therefore, a conventional color filter and a conventional lower polarization plate may be omitted to reduce the cost of manufacturing a display device. Furthermore, the simplified structure may shorten the pathway of light and reduce loss of the light, improving optical efficiency.

Exemplary Embodiment 2

Figure 7:
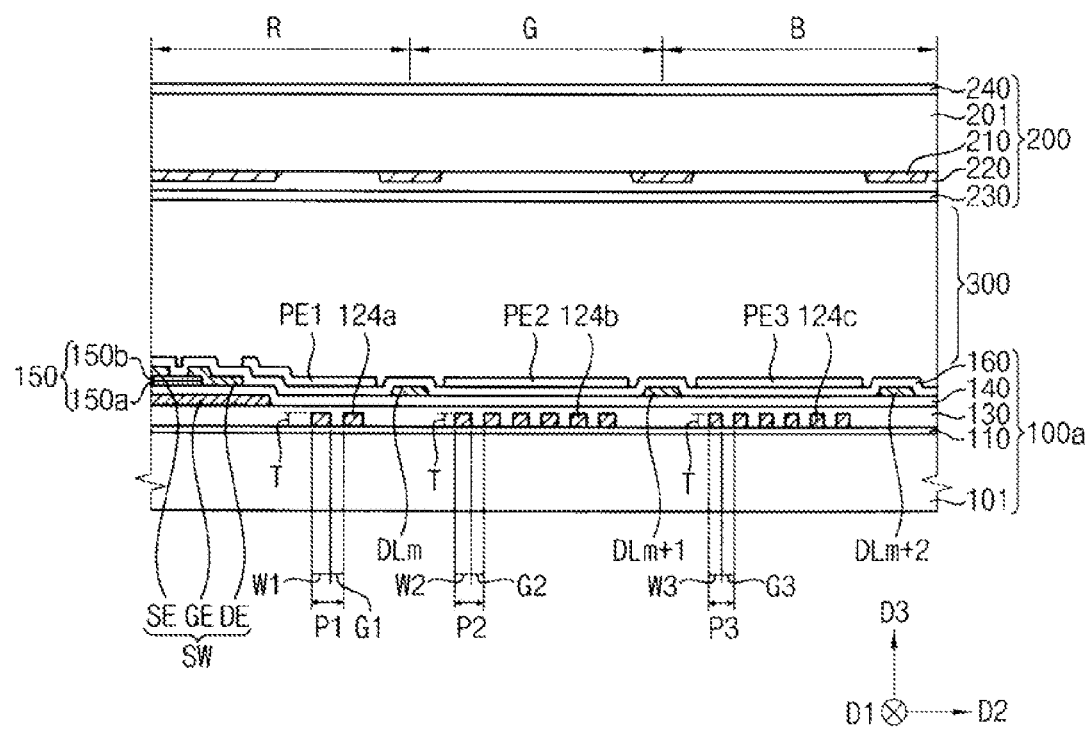
FIG. 7 is a cross-sectional view illustrating a display device in accordance with Exemplary Embodiment 2 of the present invention.

FIG. 7 is a cross-sectional view illustrating a display device in accordance with Exemplary Embodiment 2 of the present invention.

The display device described with reference to FIG. 7 may be substantially the same as the display device described with reference to FIG. 1 and FIG. 2 except that the first nano metal wires 124a, the second nano metal wires 124b and the third nano metal wires 124c have substantially the same thickness. Therefore, the same reference numbers are used for the same or similar elements, and any further descriptions concerning the same or similar elements as those shown in FIG. 1 and FIG. 2 will be omitted.

Referring to FIG. 7, a display device in accordance with Exemplary Embodiment 2 of the present invention includes a first display substrate 100a, a second display substrate 200 facing the first display substrate 100a, and a liquid crystal layer 300 interposed between the first display substrate 100a and the second display substrate 200.

The first display substrate 100a may include a first base substrate 101, a first dielectric layer 110, a plurality of first nano metal wires 124a, a plurality of second nano metal wires 124b, a plurality of third nano metal wires 124c, a second dielectric layer 130, a gate electrode GE, a gate insulation layer 140, a plurality of data lines DLm, DLm+1 and DLm+2, a passivation layer 160 and a plurality of pixel electrodes PE1, PE2 and PE3.

The first nano metal wires 124a have a first width W1 and a first thickness T. The first nano metal wires 124a extend in a first direction D1. The first nano metal wires 124a may be formed at a first period P1 along a second direction D2 different from the first direction D1. The first nano metal wires 124a may be separated from each other by a first gap G1 in the second direction D2.

The second nano metal wires 124b have a second width W2 and the first thickness T. The second width W2 is different from the first width W1. The second nano metal wires 124b extend in the first direction D1. The second nano metal wires 124b may be periodically formed at a second period P2 along the second direction D2. The second nano metal wires 124b may be separated from each other by a second gap G2 in the second direction D2.

The third nano metal wires 124c have a third width W3 and the first thickness T. The third width W3 is different from the second width W2 and the first width W1. The third nano metal wires 124c extend in the first direction D1. The third nano metal wires 124c may be formed at a third period P3 along the second direction D2. The third nano metal wires 124c may be separated from each other by a third gap G3 in the second direction D2. The third gap G3 may be different from the second gap G2 and the first gap G1.

The second dielectric layer 130 is formed on the first base substrate 101 on which the first, second and third nano metal wires 124a, 124b and 124c are formed. The second dielectric layer 130 covers the first, second and third nano metal wires 124a, 124b and 124c. The second dielectric layer 130 may contain substantially the same dielectric material as the first dielectric layer 110.

The second display substrate 200 may include a second base substrate 201, a light-blocking layer 210, an overcoat layer 220, a common electrode 230 and an upper polarization plate 240.

Figure 8A:
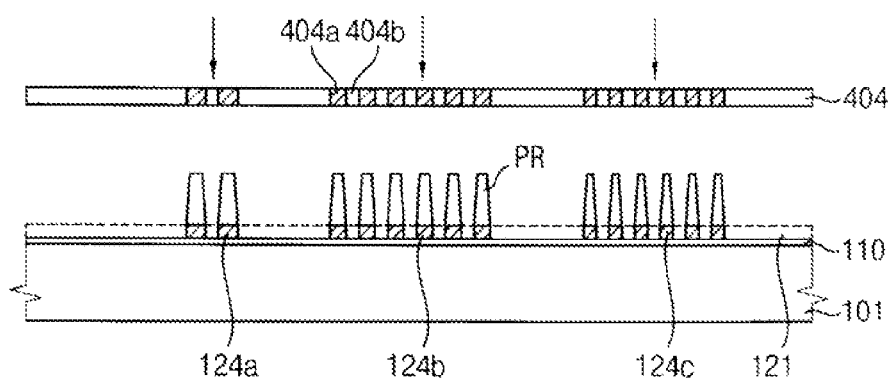
FIG. 8A and FIG. 8B are cross-sectional views illustrating exemplary processes of manufacturing the first display substrate illustrated in FIG. 7.
Figure 8B:
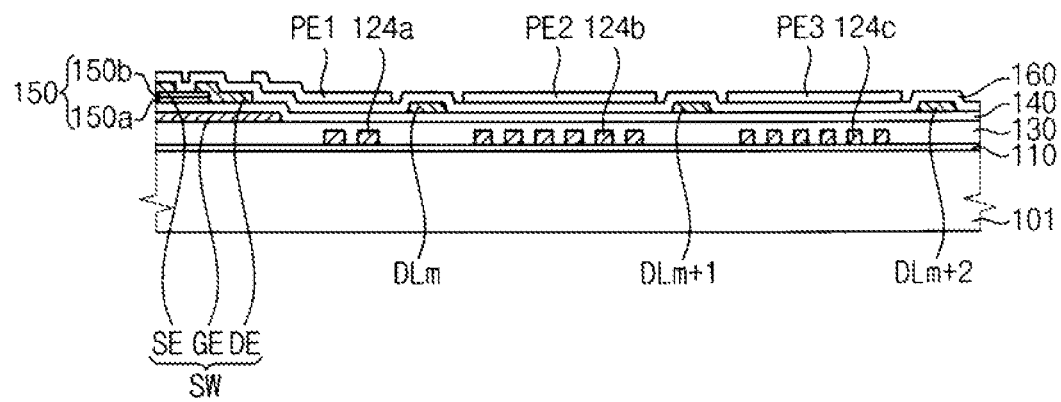

FIG. 8A and FIG. 8B are cross-sectional views illustrating exemplary processes of manufacturing the first display substrate illustrated in FIG. 7.

Referring to FIG. 8A, the first dielectric layer 110 is formed on the first base substrate 101. The first dielectric layer 110 may contain silicon oxide ($SiO_2$). A metal layer 121 is formed on the first base substrate 101 including the first dielectric layer 110. The metal layer 121 may contain a metal such as silver (Ag), gold (Au), aluminum (Al), etc. A photoresist layer is formed on the first base substrate 101 on which the metal layer 121 is formed.

The photoresist layer is patterned by using a mask 404 having a plurality of shading portions 404a and a plurality of transparent portions 404b to form a photoresist pattern PR at regions where the first, second and third nano metal wires 124a, 124b and 124c are to be formed. The shading portions 404a are disposed at regions corresponding to the regions where the first, second and third nano metal wires 124a, 124b and 124c are to be formed. The transparent portions 404b are disposed at regions corresponding to the regions where the thin-film transistor SW, the data lines DLm, DLm+1 and DLm+2, and the first, second and third gaps G1, G2 and G3 are to be formed. The metal layer 121 is patterned by using the photoresist pattern PR to form the first, second and third nano metal wires 124a, 124b and 124c.

Referring to FIG. 8B, the second dielectric layer 130 is formed on the first base substrate 101 on which the first, second and third nano metal wires 124a, 124b and 124c are formed. A gate metal layer is formed on the first base substrate 101 on which the second dielectric layer 130 is formed. The gate metal layer is patterned to form a gate metal pattern including the gate electrode GE and the gate lines GLn−1 and GLn. The gate insulation layer 140 is formed on the first base substrate 101 on which the gate metal pattern is formed.

The active pattern 150 is formed on the first base substrate 101 on which the gate insulation layer 140 is formed. A data metal layer is formed on the first base substrate 101 on which the active pattern 150 is formed. The data metal layer is patterned to form a data metal pattern including the source electrode SE, the drain electrode DE and the data lines DLm, DLm+1 and DLm+2.

A passivation layer 160 is formed on the first base substrate 101 on which the data metal pattern is formed. A transparent conductive layer is formed on the first base substrate 101 on which the passivation layer 160 is formed. The transparent conductive layer is patterned to form the pixel electrodes PE1, PE2 and PE3.

According to Exemplary Embodiment 2 of the present invention, a contact between the first, second and third nano metal wires 124a, 124b and 124c, and the first and second dielectric layers 110 and 130 may generate surface plasmon resonance and induce polarized color light. Therefore, a conventional color filter and a conventional lower polarization plate may be omitted to reduce the cost of manufacturing a display device. Furthermore, the simplified structure may shorten the pathway of light and reduce a loss of the light, improving optical efficiency.

Exemplary Embodiment 3

Figure 9:
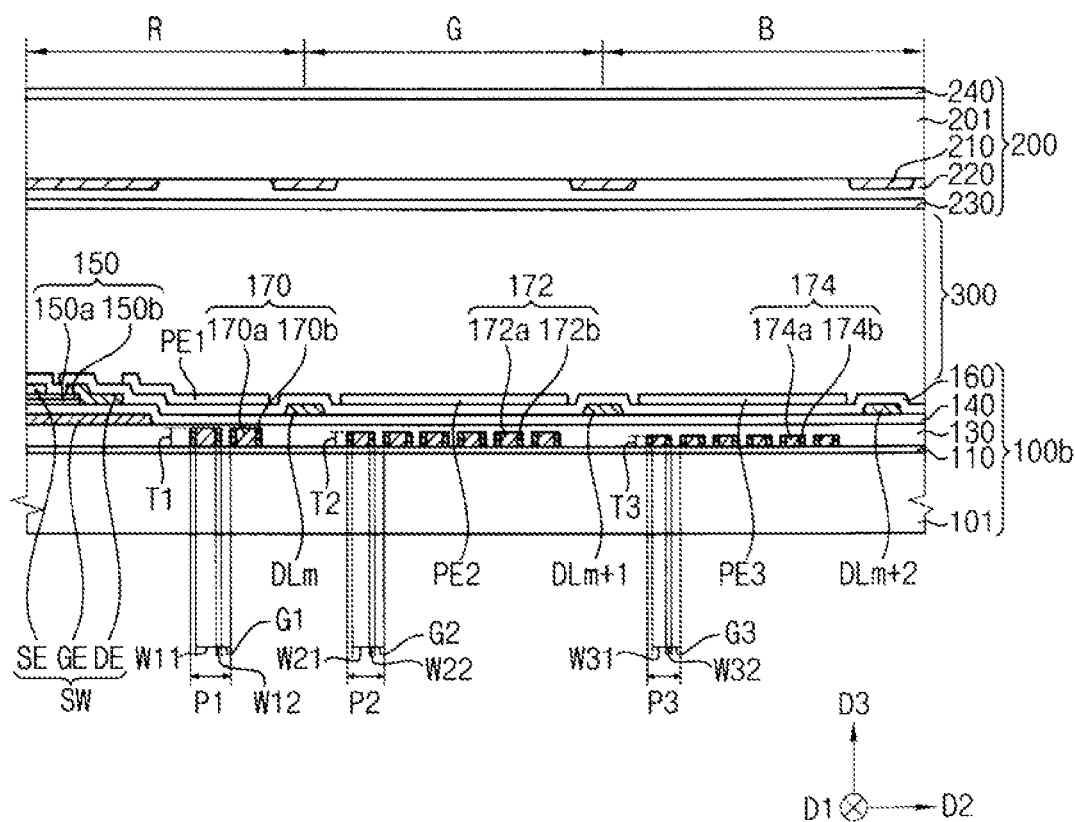
FIG. 9 is a cross-sectional view illustrating a display device in accordance with Exemplary Embodiment 3 of the present invention.

FIG. 9 is a cross-sectional view illustrating a display device in accordance with Exemplary Embodiment 3 of the present invention.

The display device described with reference to FIG. 9 may be substantially the same as the display device described with reference to FIG. 2 except first nano metal wires 170, second nano metal wires 172 and third nano metal wires 174. Therefore, the same reference numbers are used for the same or similar elements, and any further descriptions concerning the same or similar elements as those shown in FIG. 2 will be omitted.

Referring to FIG. 9, a display device in accordance with Exemplary Embodiment 3 of the present invention includes a first display substrate 100b, the second display substrate 200 facing the first display substrate 100b, and the liquid crystal layer 300 interposed between the first display substrate 100b and the second display substrate 200.

The first display substrate 100b may include a first base substrate 101, a first dielectric layer 110, a plurality of first nano metal wires 170, a plurality of second nano metal wires 172, a plurality of third nano metal wires 174, a second dielectric layer 130, a gate electrode GE, a gate insulation layer 140, a plurality of data lines DLm, DLm+1 and DLm+2, a passivation layer 160 and a plurality of pixel electrodes PE1, PE2 and PE3.

The first nano metal wires 170 are formed at a first color pixel region R. The first nano metal wires 170 have a first thickness T1. The first nano metal wires 170 extend in a first direction D1. The first nano metal wires 170 may be formed at a first period P1 along a second direction D2 different from the first direction D1. The first nano metal wires 170 may be separated from each other by a first gap G1 in the second direction D2. For example, the first thickness T1 may be about 100 nm. The first period P1 may be about 285 nm, and the first gap G1 may be about 50 nm.

The first nano metal wires 170 include a plurality of first main wires 170a and a plurality of first sub wires 170b. The first main wires 170a contain a first metal. The first main wires 170a have a first width W11.

The first sub wires 170b have a second width W12. The first sub wires 170b are adjacent to the first main wires 170a, and may contact both sides of the first main wires 170a. The first sub wires 170b contain a second metal different from the first metal. For example, the first metal may be aluminum (Al), and the second metal may be silver (Ag). The second width W12 may be different from the first width W11.

The second nano metal wires 172 are formed at a second color pixel region G adjacent to the first color pixel region R. The second nano metal wires 172 have a second thickness T2 different from the first thickness T1. The second nano metal wires 172 extend in the first direction D1, and may be formed at a second period P2 along the second direction D2. The second nano metal wires 172 may be separated from each other by a second gap G2 in the second direction D2. For example, the second thickness T2 may be about 70 nm. The second period P2 may be about 340 nm, and the second gap G2 may be about 40 nm.

The second nano metal wires 172 include a plurality of second main wires 172a and a plurality of second sub wires 172b. The second main wires 172a contain a first metal. The second main wires 172a have a third width W21. The third width W21 may be different from the first width W11.

The second sub wires 172b are adjacent to the second main wires 172a, and may be in contact with both sides of the second main wires 172a. The second sub wires 172b contain a second metal different from the first metal. For example, the first metal may be aluminum (Al), and the second metal may be silver (Ag). The second sub wires 172b may have a fourth width W22 different from the third width W21.

The third nano metal wires 174 are formed at a third color pixel region B adjacent to the second color pixel region G. The third nano metal wires 174 have a third thickness T3 different from the second thickness T2 and the first thickness T1. The third nano metal wires 174 extend in the first direction D1, and may be formed at a third period P3 along the second direction D2. The third nano metal wires 174 may be separated from each other by a third gap G3 in the second direction D2. For example, the third thickness T3 may be about 60 nm. The third period P3 may be about 280 nm, and the third gap G3 may be about 60 nm.

The third nano metal wires 174 include a plurality of third main wires 174a and a plurality of third sub wires 174b. The third main wires 174a contain a first metal. The third main wires 174a have a fifth width W31. The fifth width W31 may be different from the third width W21.

The third sub wires 174b are adjacent to the third main wires 174a, and may be in contact with both sides of the third main wires 174a. The third sub wires 174b contain a second metal different from the first metal. For example, the first metal may be aluminum (Al), and the second metal may be silver (Ag). The third sub wires 174b may have a sixth width W32 different from the fifth width W31.

The second display substrate 200 may include a second base substrate 201, a light-blocking layer 210, an overcoat layer 220, a common electrode 230 and an upper polarization plate 240.

Figure 10A:
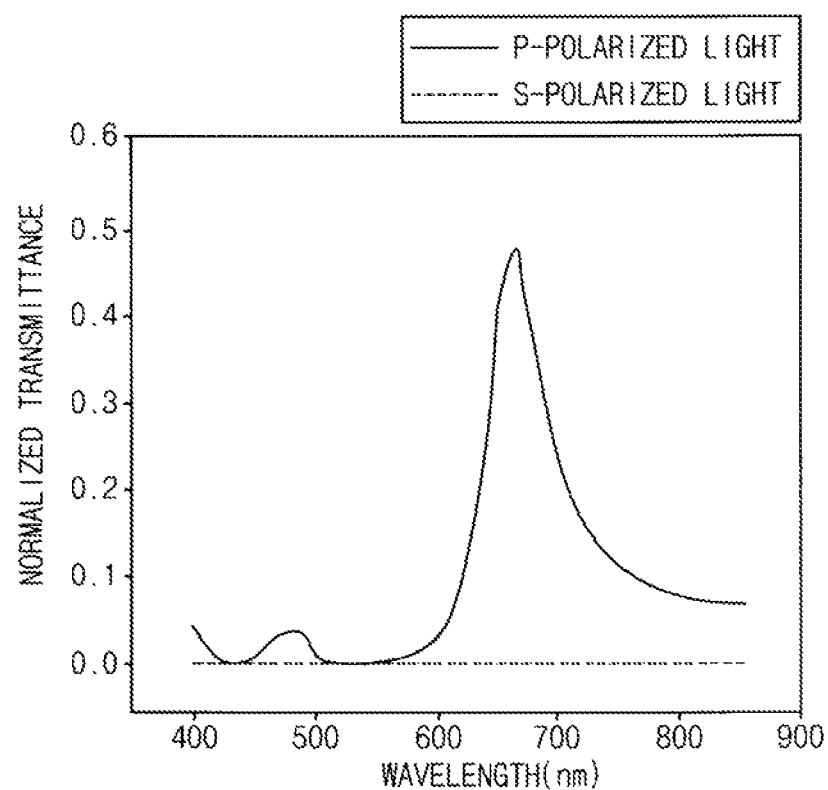
FIG. 10A and FIG. 10B are graphs for describing optical transmittance and polarization efficiency of incident light according to wavelength using the first nano metal wires in FIG. 9.
Figure 10B:
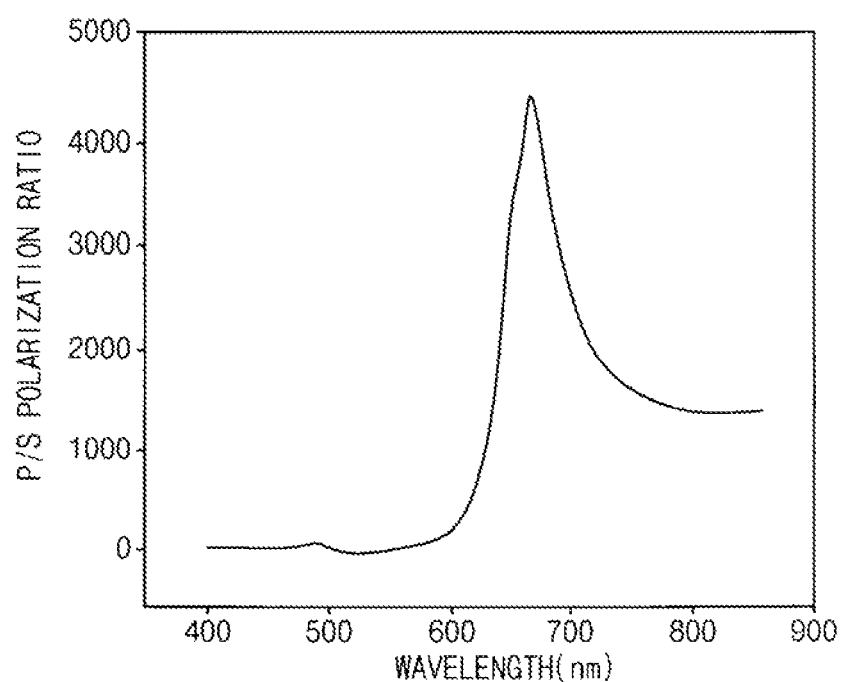

FIG. 10A and FIG. 10B are graphs for describing optical transmittance and polarization efficiency of incident light according to a wavelength. The size of the first nano metal wires that are used is about the same as in the embodiment of FIG. 9.

The graphs in FIG. 10A and FIG. 10B show results of simulation for measuring the optical transmittance and polarization efficiency. In one simulation, the thickness of the first nano metal wires 170 in FIG. 9 was about 100 nm, and the first nano metal wires were formed at a period P1 of about 285 nm and at a gap G1 of about 50 nm between the adjacent first nano metal wires. The width W12 of the first sub wires 170b was about 20 nm. Further, the first and second dielectric layers contained silicon oxide ($SiO_2$). The first main wires 170a contained aluminum (Al), and the first sub wires 170b contained silver (Ag). Furthermore, a first lattice pattern including the first nano metal wires was configured to transmit a P-polarized component and reflect an S-polarized component.

Referring to FIG. 10A and FIG. 10B, optical transmittance and polarization efficiency of the P-polarized component of the incident light were the highest at a wavelength of about 650 nm (i.e., a wavelength of red light). The graph of the optical transmittance at the wavelength of red light shows a narrower peak, compared to the embodiment that does not include the first sub wires (i.e., compared to the graph shown in FIG. 3A). That is, the first sub wires 170b contribute to producing a more vivid red color. Accordingly, when the first and second dielectric layers and the first nano metal wires including the first sub wires meet the above conditions, the first and second dielectric layers and the first nano metal wires may produce red color light having high purity of color. However, the polarization efficiency is relatively low, compared to the embodiment that does not include the first sub wires (i.e., compared to the graph shown in FIG. 3B).

Figure 11A:
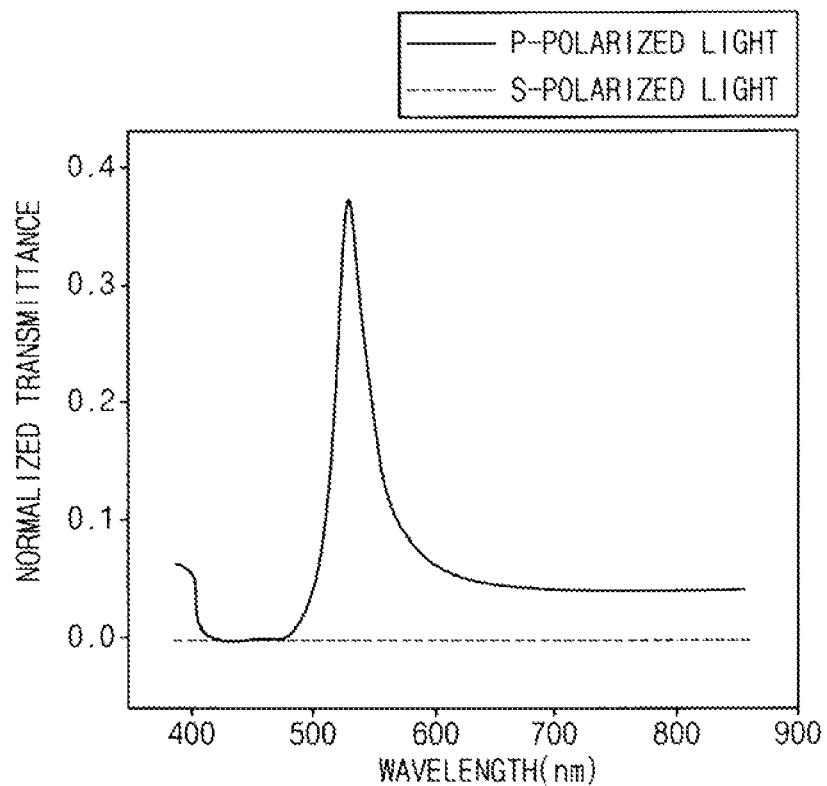
FIG. 11A and FIG. 11B are graphs for describing optical transmittance and polarization efficiency of incident light according to wavelength using the second nano metal wires in FIG. 9.
Figure 11B:
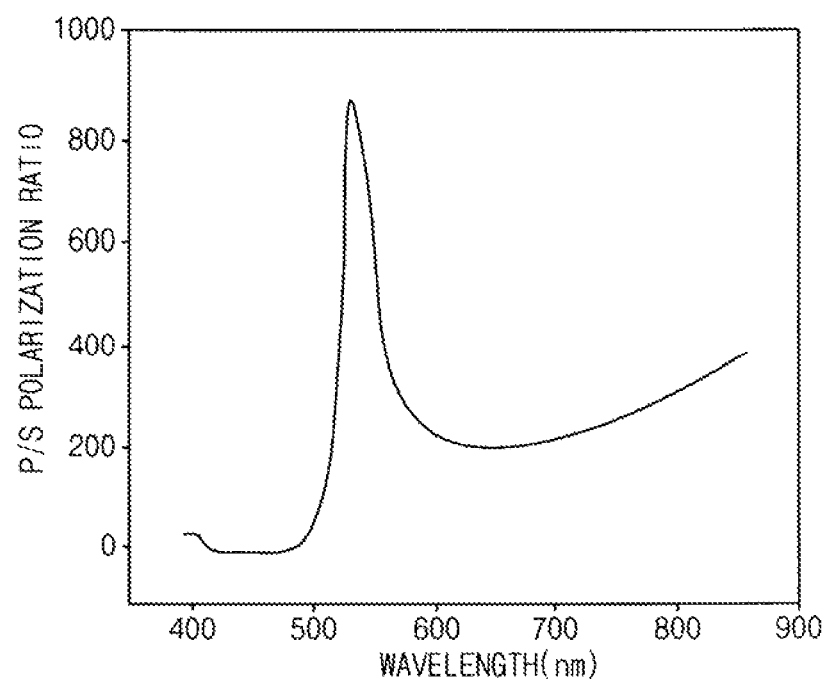

FIG. 11A and FIG. 11B are graphs for describing optical transmittance and polarization efficiency of incident light according to wavelength. The size of the second nano metal wires used is about the same as in the embodiment of FIG. 9.

The graphs in FIG. 11A and FIG. 11B show results of simulation for measuring the optical transmittance and polarization efficiency. In one simulation, the thickness of the second nano metal wires 172 in FIG. 9 was about 70 nm, and the second nano metal wires were periodically formed at a period P2 of about 340 nm and at a gap G2 of about 40 nm between the adjacent second nano metal wires. The width W22 of the second sub wires 172b was about 10 nm. Further, the first and second dielectric layers contained silicon oxide ($SiO_2$). The second main wires 172a contained aluminum (Al), and the second sub wires 172b contained silver (Ag). Furthermore, a second lattice pattern including the second nano metal wires was configured to transmit a P-polarized component and reflect an S-polarized component.

Referring to FIG. 11A and FIG. 11B, optical transmittance and polarization efficiency of the P-polarized component of the incident light were the highest at a wavelength of about 550 nm (i.e., a wavelength of green light). The graph of the optical transmittance at around the wavelength of green light was shaper, compared to the embodiment that does not include the second sub wires (i.e., compared to the graph shown in FIG. 4A). That is, the second sub wires 172b contribute to producing a more vivid green color. Accordingly, when the first and second dielectric layers and the second nano metal wires including the second sub wires meet the above conditions, the first and second dielectric layers and the second nano metal wires may produce green color light having high purity of color. However, the polarization efficiency is relatively low, compared to the embodiment that does not include the second sub wires (i.e., compared to the graph shown in FIG. 4B).

Figure 12A:
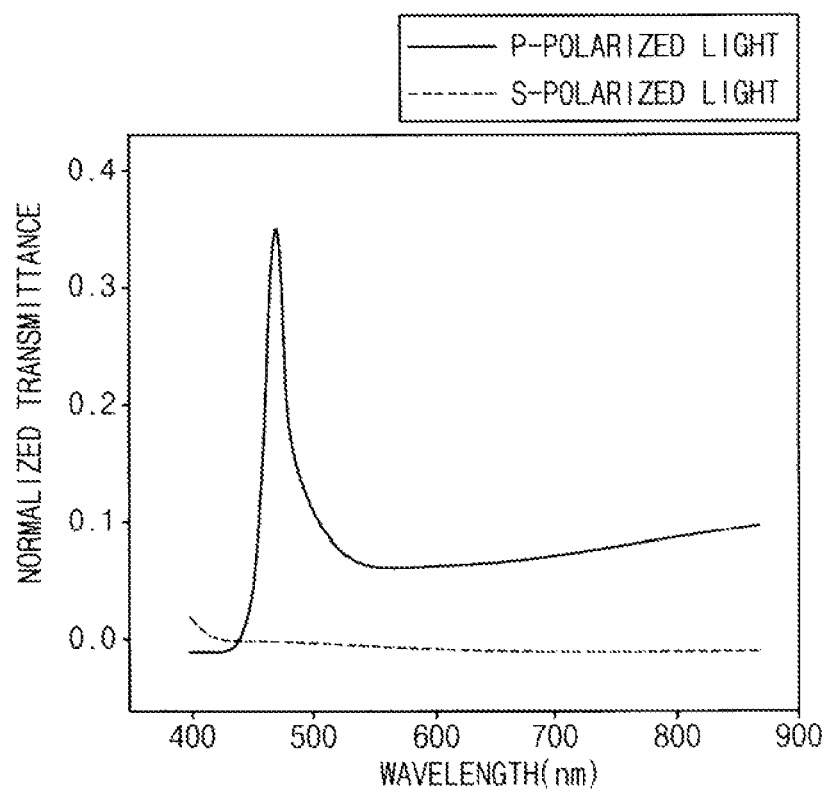
FIG. 12A and FIG. 12B are graphs for describing optical transmittance and polarization efficiency of incident light according to wavelength using the third nano metal wires in FIG. 9.
Figure 12B:
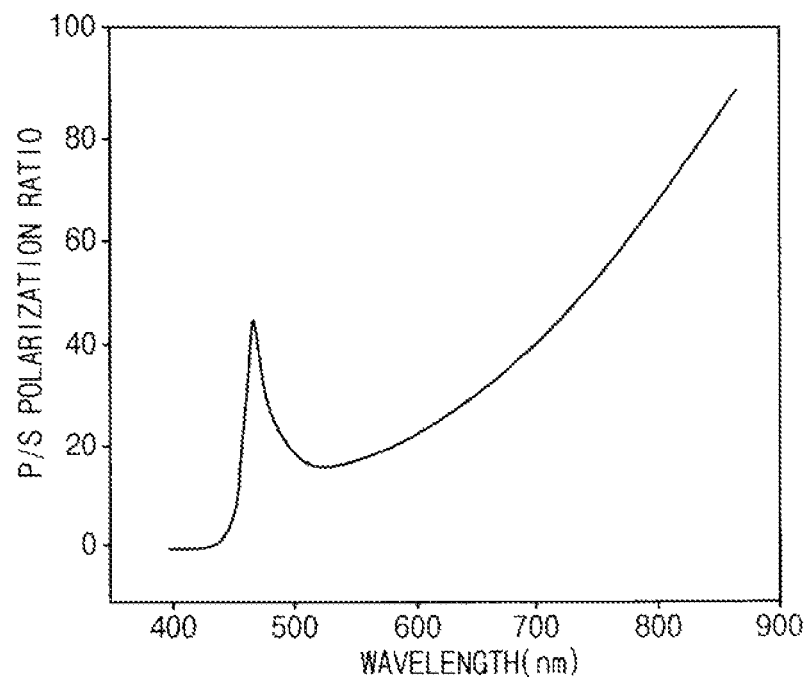

FIG. 12A and FIG. 12B are graphs for describing optical transmittance and polarization efficiency of incident light according to wavelength. The size of the third nano metal wires that are used is about the same as in the embodiment of FIG. 9.

The graphs in FIG. 12A and FIG. 12B show results of simulation for measuring the optical transmittance and polarization efficiency. In one simulation, the thickness T3 of the third nano metal wires 174 in FIG. 9 was about 70 nm, and the third nano metal wires were formed at a period P3 of about 280 nm and at a gap G3 of about 60 nm between the adjacent third nano metal wires. The width W32 of the third sub wires 174b was about 10 nm. Further, the first and second dielectric layers contained silicon oxide ($SiO_2$). The third main wires 174a contained aluminum (Al), and the third sub wires 174b contained silver (Ag). Furthermore, a third lattice pattern including the third nano metal wires was configured to transmit a P-polarized component and reflect an S-polarized component.

Referring to FIG. 12A and FIG. 12B, optical transmittance and polarization efficiency of the P-polarized component of the incident light were the highest at a wavelength of about 450 nm (i.e., a wavelength of blue light). The graph of the optical transmittance at around the wavelength of blue light showed a narrower peak, compared to the embodiment that does not include the second sub wires (i.e., compared to the graph shown in FIG. 5A). That is, the third sub wires 174b contribute to induce vivid blue color. Accordingly, when the first and second dielectric layers and the third nano metal wires including the third sub wires meet the above conditions, the first and second dielectric layers and the third nano metal wires may induce blue color light having high purity of color. However, the polarization efficiency was considerably reduced.

FIGS. 13A to 13G are cross-sectional views illustrating exemplary processes of manufacturing the first display substrate illustrated in FIG. 9.

Figure 13A:
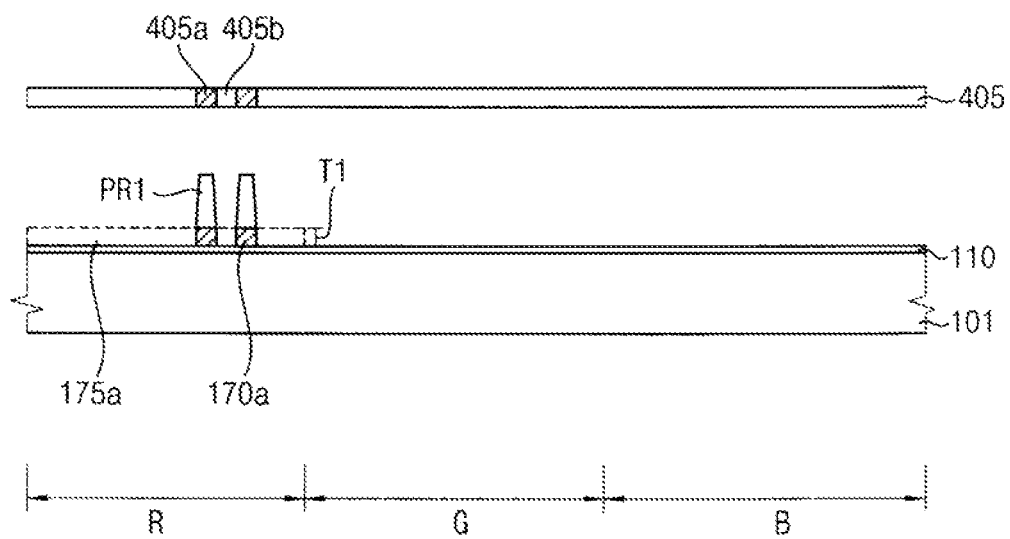
FIGS. 13A to 13G are cross-sectional views illustrating exemplary processes of manufacturing the first display substrate illustrated in FIG. 9.

Referring to FIG. 9 and FIG. 13A, the first dielectric layer 110 may be formed on a whole surface of the first base substrate 101. A first metal layer 175a having a first thickness T1 is formed at a first color pixel region R on the first base substrate 101 including the first dielectric layer 110. The first metal layer 175a contains a first metal. A first photoresist layer is formed on the first base substrate 101 including the first metal layer 175a. The first photoresist layer is patterned by using a first mask 405 having a plurality of first shading portions 405a and a plurality of first transparent portions 405b to form a first photoresist pattern PR1 at the region where the first main wires 170a are to be formed. The first metal layer 175a is patterned by using the first photoresist pattern PR1 to form the first main wires 170a at the first color pixel region R.

Figure 13B:
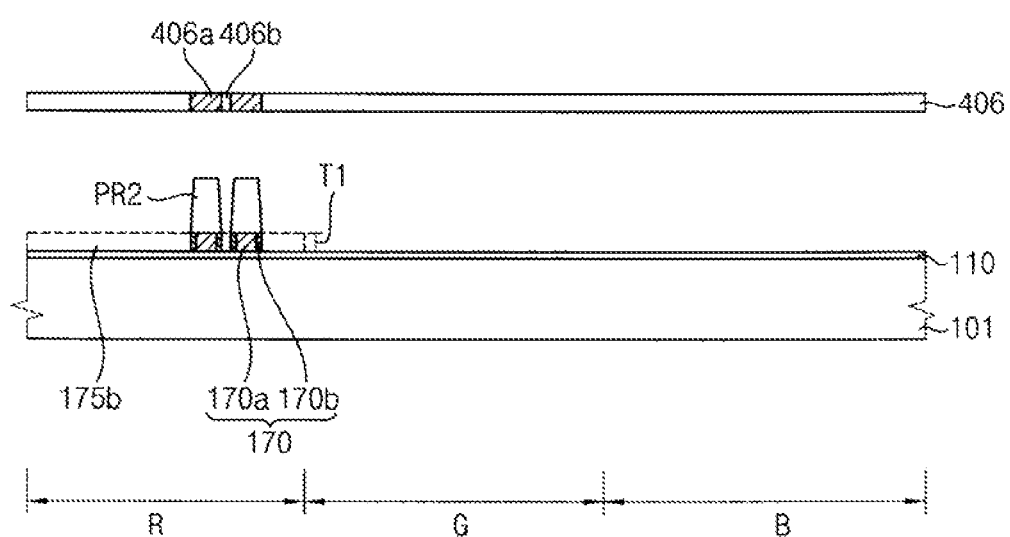

Referring to FIG. 13B, a second metal layer 175b having the first thickness T1 is formed at the first color pixel region R on the first base substrate 101 including the first main wires 170a. The second metal layer 175b contains a second metal different from the first metal. A second photoresist layer is formed on the first base substrate 101 including the second metal layer 175b. The second photoresist layer is patterned by using a second mask 406 having a plurality of second shading portions 406a and a plurality of second transparent portions 406b to form a second photoresist pattern PR2 at the region where the first sub wires 170b are to be formed. The second metal layer 175b is patterned by using the second photoresist pattern PR2 to form the first sub wires 170b that are adjacent to the first main wires 170a. In some embodiments, the first sub wires 170b make contact with both sides of the first main wires 170a. Accordingly, the first nano metal wires 170 including the first main wires 170a and the first sub wires 170b are formed at the first color pixel region R.

Figure 13C:
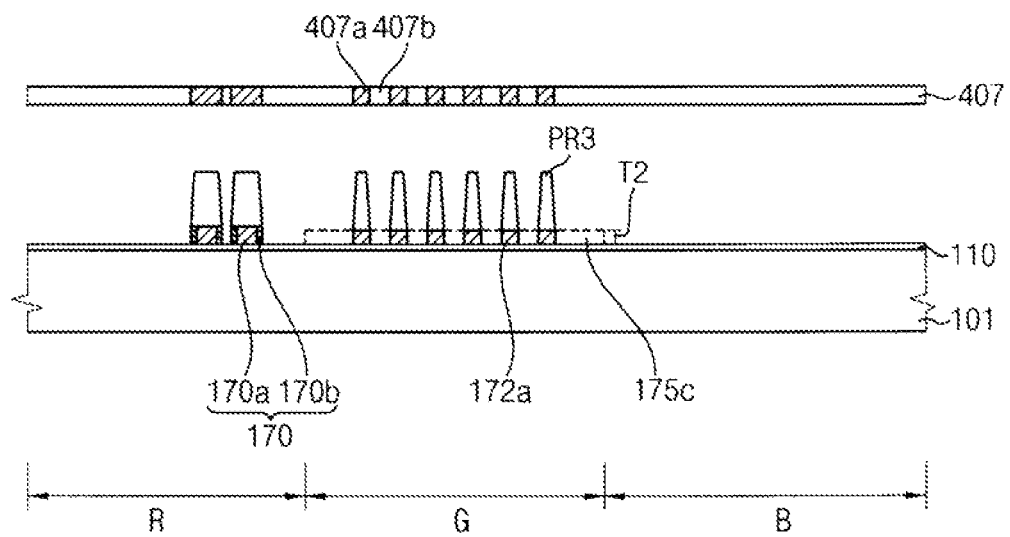

Referring to FIG. 13C, a third metal layer 175c having a second thickness T2 different from the first thickness T1 is formed at a second color pixel region G on the first base substrate 101 including the first nano metal wires 170. The third metal layer 175c contains the first metal. A third photoresist layer is formed on the first base substrate 101 including the third metal layer 175c. The third photoresist layer is patterned by using a third mask 407 having a plurality of third shading portions 407a and a plurality of third transparent portions 407b to form a third photoresist pattern PR3 at the region where the second main wires 172a are to be formed. The third metal layer 175c is patterned by using the third photoresist pattern PR3 to form the second main wires 172a at the second color pixel region G.

Figure 13D:
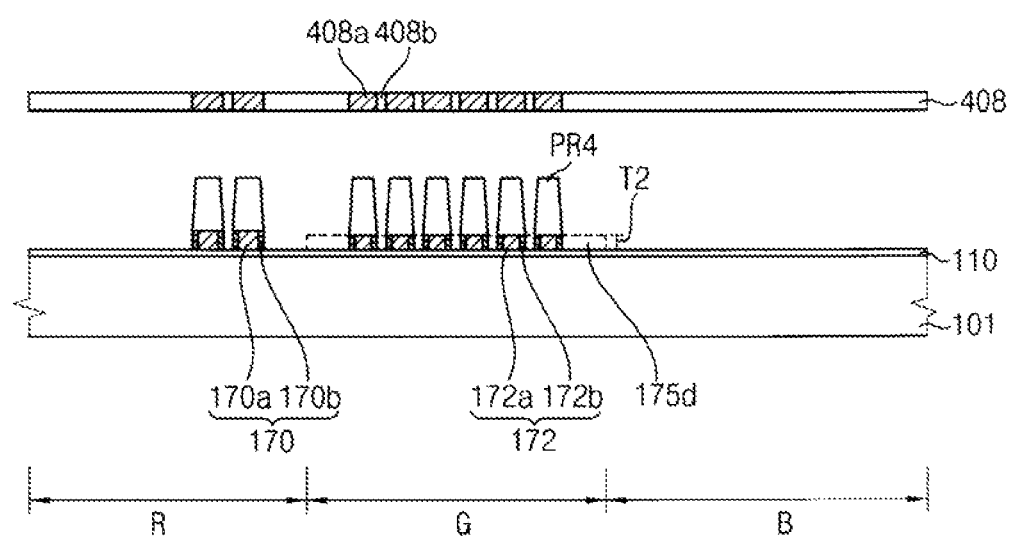

Referring to FIG. 13D, a fourth metal layer 175d having the second thickness T2 is formed at the second color pixel region G on the first base substrate 101 including the second main wires 172a. The fourth metal layer 175d contains the second metal. A fourth photoresist layer is formed on the first base substrate 101 including the fourth metal layer 175d. The fourth photoresist layer is patterned by using a fourth mask 408 having a plurality of fourth shading portions 408a and a plurality of fourth transparent portions 408b to form a fourth photoresist pattern PR4 at the region where the second sub wires 172b are to be formed. The fourth metal layer 175d is patterned by using the fourth photoresist pattern PR4 to form the second sub wires 172b adjacent to the second main wires 172a. In some embodiments, the second sub wires 172b may be in contact with both sides of the second main wires 172a. Accordingly, the second nano metal wires 172 including the second main wires 172a and the second sub wires 172b are formed at the second color pixel region G.

Figure 13E:
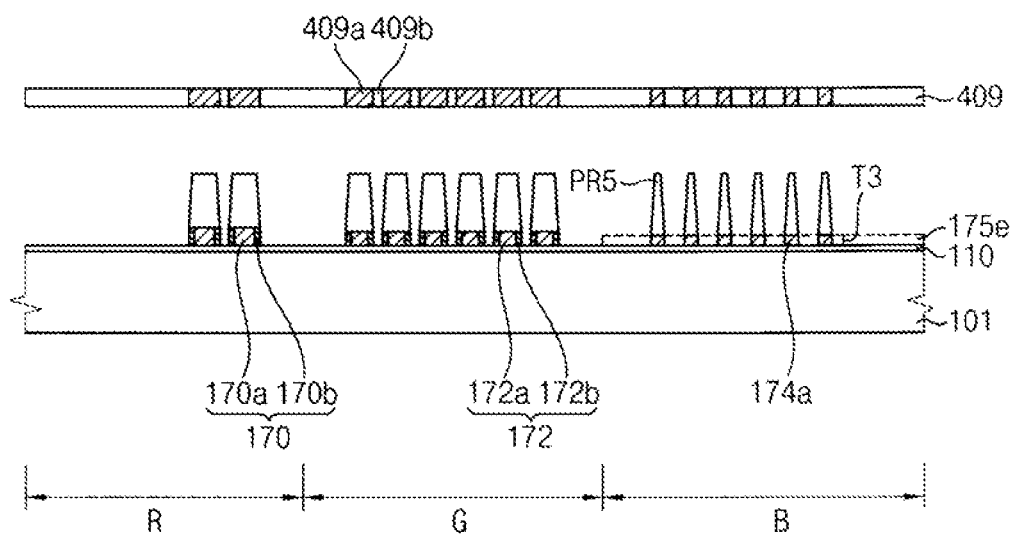

Referring to FIG. 13E, a fifth metal layer 175e having a third thickness T3 different from the second thickness T2 is formed at a third color pixel region B on the first base substrate 101 including the first nano metal wires 170 and the second nano metal wires 172. The fifth metal layer 175e contains the first metal. A fifth photoresist layer is formed on the first base substrate 101 including the fifth metal layer 175e. The fifth photoresist layer is patterned by using a fifth mask 409 having a plurality of fifth shading portions 409a and a plurality of fifth transparent portions 409b to form a fifth photoresist pattern PR5 at the region where the third main wires 174a are to be formed. The fifth metal layer 175e is patterned by using the fifth photoresist pattern PR5 to form the third main wires 174a at the third color pixel region B.

Figure 13F:
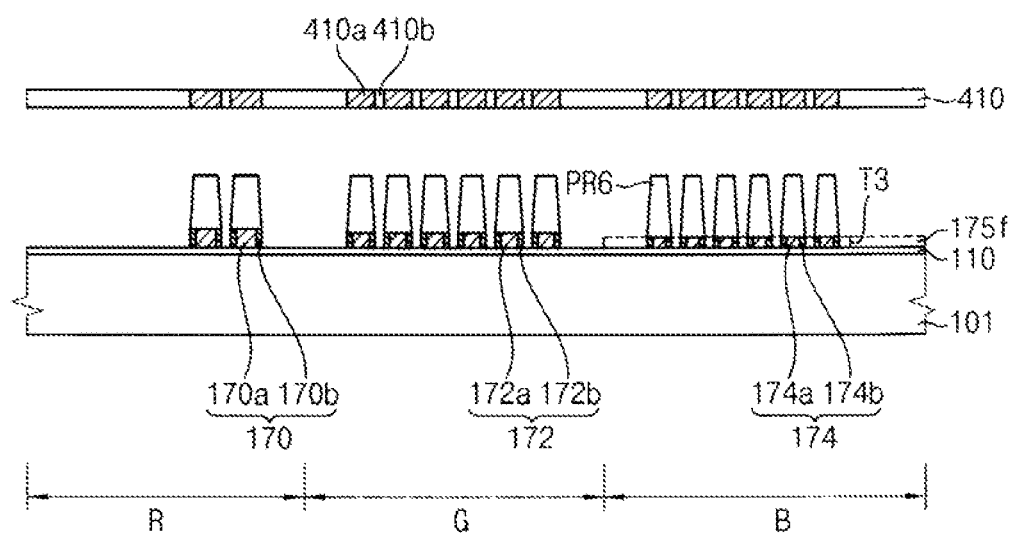

Referring to FIG. 13F, a sixth metal layer 175f having the third thickness T3 is formed at the third color pixel region B on the first base substrate 101 including the third main wires 174a. The sixth metal layer 175f contains the second metal. A sixth photoresist layer is formed on the first base substrate 101 including the sixth metal layer 175f. The sixth photoresist layer is patterned by using a sixth mask 410 having a plurality of sixth shading portions 410a and a plurality of sixth transparent portions 410b to form a sixth photoresist pattern PR6 at the region where the third sub wires 174b are to be formed. The sixth metal layer 175f is patterned by using the sixth photoresist pattern PR6 to form the third sub wires 174b adjacent to (e.g., making contact with both sides of) the third main wires 174a. Accordingly, the third nano metal wires 174 including the third main wires 174a and the third sub wires 174b are formed at the third color pixel region B.

Figure 13G:
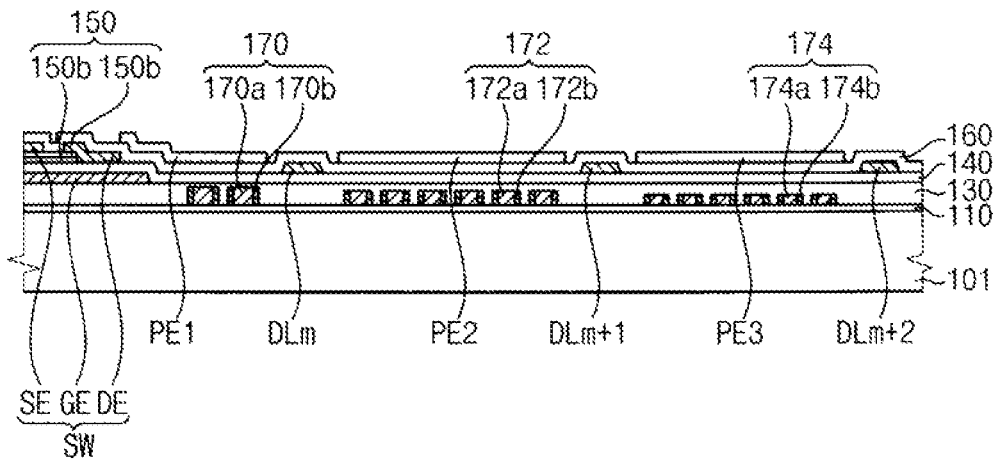

Referring to FIG. 13G, the second dielectric layer 130 is formed on the first base substrate 101 on which the first, second and third nano metal wires 170, 172 and 174 are formed. The second dielectric layer 130 covers the first, second and third nano metal wires 170, 172 and 174, and covers the gaps between adjacent nano metal wires of the first, second and third nano metal wires 170, 172 and 174. A gate metal layer is formed on the first base substrate 101 on which the second dielectric layer 130 is formed. The gate metal layer is patterned to form a gate metal pattern including the gate electrode GE and the gate lines GLn−1 and GLn. The gate insulation layer 140 is formed on the first base substrate 101 on which the gate metal pattern is formed.

The active pattern 150 is formed on the first base substrate 101 on which the gate insulation layer 140 is formed. A data metal layer is formed on the first base substrate 101 on which the active pattern 150 is formed. The data metal layer is patterned to form a data metal pattern including the source electrode SE, the drain electrode DE and the data lines DLm, DLm+1 and DLm+2. A passivation layer 160 is formed on the first base substrate 101 on which the data metal pattern is formed. A transparent conductive layer is formed on the first base substrate 101 on which the passivation layer 160 is formed. The transparent conductive layer is patterned to form the pixel electrodes PE1, PE2 and PE3.

According to Exemplary Embodiment 3 of the present invention, each of the first, second and third nano metal wires 170, 172 and 174 has a multi-layer structure including a main wire and a sub wire which contain different materials. Accordingly, vivid color or color with high purity may be obtained, so that display quality may be improved.

Exemplary Embodiment 4

Figure 14:
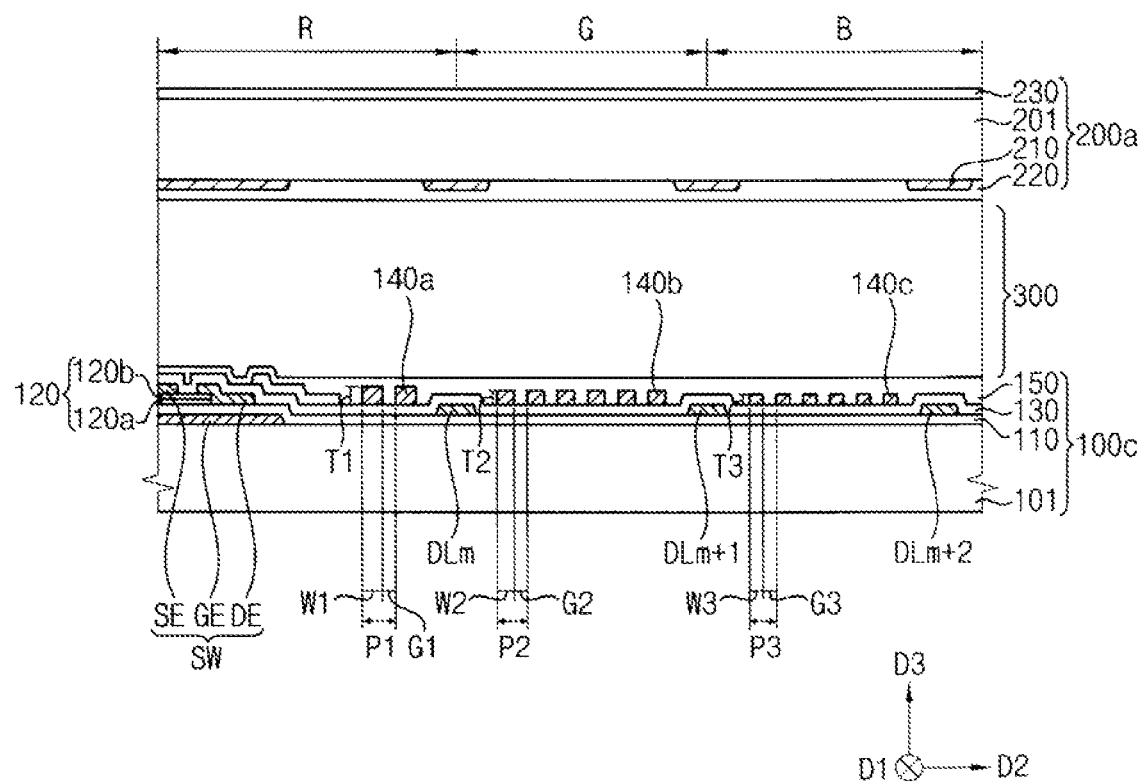
FIG. 14 is a cross-sectional view illustrating a display device in accordance with Example Embodiment 4 of the present invention.

FIG. 14 is a cross-sectional view illustrating a display device in accordance with Exemplary Embodiment 4 of the present invention.

Referring to FIG. 14, a display device in accordance with Exemplary Embodiment 4 of the present invention includes a first display substrate 100c, a second display substrate 200a facing the first display substrate 100c, and a liquid crystal layer 300 interposed between the first display substrate 100c and the second display substrate 200a.

The first display substrate 100c includes a first base substrate 101. The first base substrate 101 includes a first color pixel region R, a second color pixel region G, and a third color pixel region B.

A gate electrode GE of a thin-film transistor SW, a gate insulation layer 110, an active pattern 120, a source electrode SE, a drain electrode DE, a plurality of data lines DLm, DLm+1 and DLm+2, a first dielectric layer 130, a plurality of first nano metal wires 140a, a plurality of second nano metal wires 140b, a plurality of third nano metal wires 140, and a second dielectric layer 150 may be formed on the first base substrate 101.

The gate insulation layer 110 is formed on the first base substrate 101 on which the gate electrode GE is formed.

The active pattern 120 is formed at a region corresponding to the thin-film transistor SW on the gate insulation layer 110. The active pattern 120 includes a semiconductor layer 120a and an ohmic contact layer 120b.

The data lines DLm, DLm+1 and DLm+2 extend in a first direction D1 on the gate insulation layer 110.

The source electrode SE overlaps the active pattern 120. The drain electrode DE is separated from the source electrode SE, and is formed to overlap the active pattern 120.

The first dielectric layer 130 may be formed on a whole surface of the first base substrate 101 including the source electrode SE, the drain electrode DE and the data lines DLm, DLm+1 and DLm+2. The first dielectric layer 130 may contain a dielectric material such as silicon oxide ($SiO_2$).

The first nano metal wires 140a are disposed at the first color pixel region R on the first base substrate 101 on which the first dielectric layer 130 is formed. each of the first nano metal wires 140a may have substantially the same size as the others. The first nano metal wires 140a may have a first width W1 and a first thickness T1. The first nano metal wires 140a extend in the first direction D1. The first nano metal wires 140a may be periodically formed at a first period P1 along a second direction D2 different from the first direction D1. The first nano metal wires 140a may be separated from each other by a first gap G1 in the second direction D2. For example, the first thickness T1 may be about 125 nm. The first gap G1 may be about 50 nm, and the first period P1 may be about 300 nm.

The second nano metal wires 140b are disposed at the second color pixel region G adjacent to the first color pixel region R. The second nano metal wires 140b have different dimensions from the first nano metal wires 140a. Each of the second nano metal wires 140b may have substantially the same size as the others. The second nano metal wires 140b may have a second width W2 and a second thickness T2. The second nano metal wires 140b extend in the first direction D1. The second nano metal wires 140b may be formed at a second period P2 along the second direction D2. The second nano metal wires 140b may be separated from each other by a second gap G2 in the second direction D2. For example, the second thickness T2 may be about 100 nm. The second gap G2 may be about 60 nm, and the second period P2 may be about 250 nm.

The third nano metal wires 140c are disposed at the third color pixel region B adjacent to the second color pixel region G. The third nano metal wires 140c have different dimensions from the second nano metal wires 140b. each of the third nano metal wires 140b may have substantially the same size as the others. The third nano metal wires 140c may have a third width W3 and a third thickness T3. The third nano metal wires 140c extend in the first direction D1. The third nano metal wires 140c may be formed at a third period P3 along the second direction D2. The third nano metal wires 140c may be separated from each other by a third gap G3 in the second direction D2. For example, the third thickness T3 may be about 75 nm. The third gap G3 may be about 60 nm, and the third period P3 may be about 230 nm.

The first, second and third nano metal wires 140a, 140b and 140c may be formed as in one of a stripe type, a circular type, a spiral type wires, among others. The first, second and third nano metal wires 140a, 140b and 140c may contain a metal such as silver (Ag), gold (Au), aluminum (Al), etc.

The first, second and third nano metal wires 140a, 140b and 140c may function as a pixel electrode and a common electrode. For example, a first pixel voltage and a common voltage may be applied to adjacent first nano metal wires 140a, respectively. By the first pixel voltage and a common voltage, a horizontal electric field is generated between the adjacent first nano metal wires 140a. A second pixel voltage and the common voltage may be applied to adjacent second nano metal wires 140b, respectively. The second pixel voltage may be different from the first pixel voltage. A third pixel voltage and the common voltage may be applied to adjacent third nano metal wires 140c, respectively. The third pixel voltage may be different from the second pixel voltage.

The second dielectric layer 150 is formed on the first base substrate 101 on which the first, second and third nano metal wires 140a, 140b and 140c are formed. The second dielectric layer 150 covers the first, second and third nano metal wires 140a, 140b and 140c, and covers the gaps G1, G2 and G3 between adjacent nano metal wires of the first, second and third nano metal wires 140a, 140b and 140c. The second dielectric layer 150 may contains substantially the same dielectric material as the first dielectric layer 130.

Although not illustrated in FIG. 14, the first display substrate 100c may further include a lower polarization plate (not illustrated) disposed under the first base substrate 101.

The second display substrate 200a may include a second base substrate 201, a light-blocking layer 210, an overcoat layer 220 and an upper polarization plate 230.

The light-blocking layer 210 may be formed at a boundary between two regions of the adjacent color pixel regions R, G and B.

The overcoat layer 220 is formed on the second base substrate 201 on which the light-blocking layer 210 is formed.

The upper polarization plate 230 may be disposed on a surface of the second display substrate 200a opposite to the surface on which the light-blocking layer 210 is formed.

In another embodiment, though not illustrated in FIG. 14, each of the first, second and third nano metal wires 140a, 140b and 140c may include a main wire and a sub wire as described in FIG. 9.

Figure 15A:
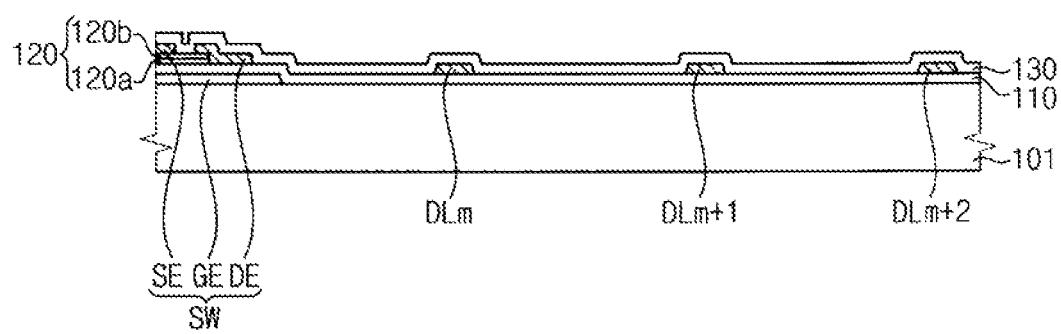
FIGS. 15A and 15B are cross-sectional views illustrating exemplary processes of manufacturing the first display substrate illustrated in FIG. 14.
Figure 15B:
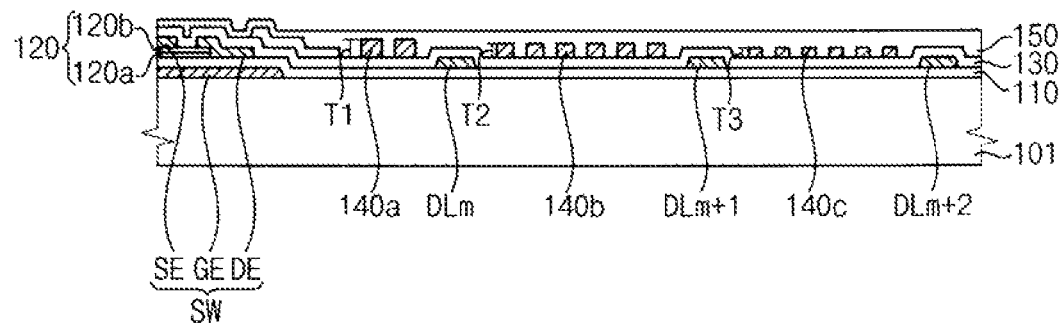

FIGS. 15A to 15B are cross-sectional views illustrating exemplary processes of manufacturing the first display substrate illustrated in FIG. 14.

Referring to FIG. 14 and FIG. 15A, a gate metal layer is formed on the first base substrate 101, and the gate metal layer is patterned to form a gate metal pattern including the gate electrode GE and the gate lines (not illustrated). The gate insulation layer 110 is formed on the first base substrate 101 on which the gate metal pattern is formed.

The active pattern 120 is formed on the first base substrate 101 on which the gate insulation layer 110 is formed. A data metal layer is formed on the first base substrate 101 on which the active pattern 120 is formed, and the data metal layer is patterned to form a data metal pattern including the source electrode SE, the drain electrode DE and the data lines DLm, DLm+1 and DLm+2.

The first dielectric layer 130 is formed on the first base substrate 101 on which the data metal pattern is formed.

Referring to FIG. 14 and FIG. 15B, the first, second and third nano metal wires 140a, 140b and 140c are formed on which the first dielectric layer 130 is formed. The method of forming the first, second and third nano metal wires 140a, 140b and 140c may be substantially the same as the method of forming the first, second and third nano metal wires 122a, 122b and 122c described with reference to FIGS. 6A to 6C. Therefore, any further descriptions concerning the same or similar elements as those shown in FIGS. 6A to 6C will be omitted.

The second dielectric layer 150 is formed on the first base substrate 101 on which the first, second and third nano metal wires 140a, 140b and 140c are formed. The second dielectric layer 150 covers the first, second and third nano metal wires 140a, 140b and 140c, and covers the gaps between adjacent nano metal wires of the first, second and third nano metal wires 140a, 140b and 140c.

According to Exemplary Embodiment 4 of the present invention, the first, second and third nano metal wires 140a, 140b and 140c function as a pixel electrode and a common electrode. Therefore, processes for forming the pixel electrode and the common electrode may be omitted to simplify the processes of manufacturing the first display substrate.

Exemplary Embodiment 5

Figure 16:
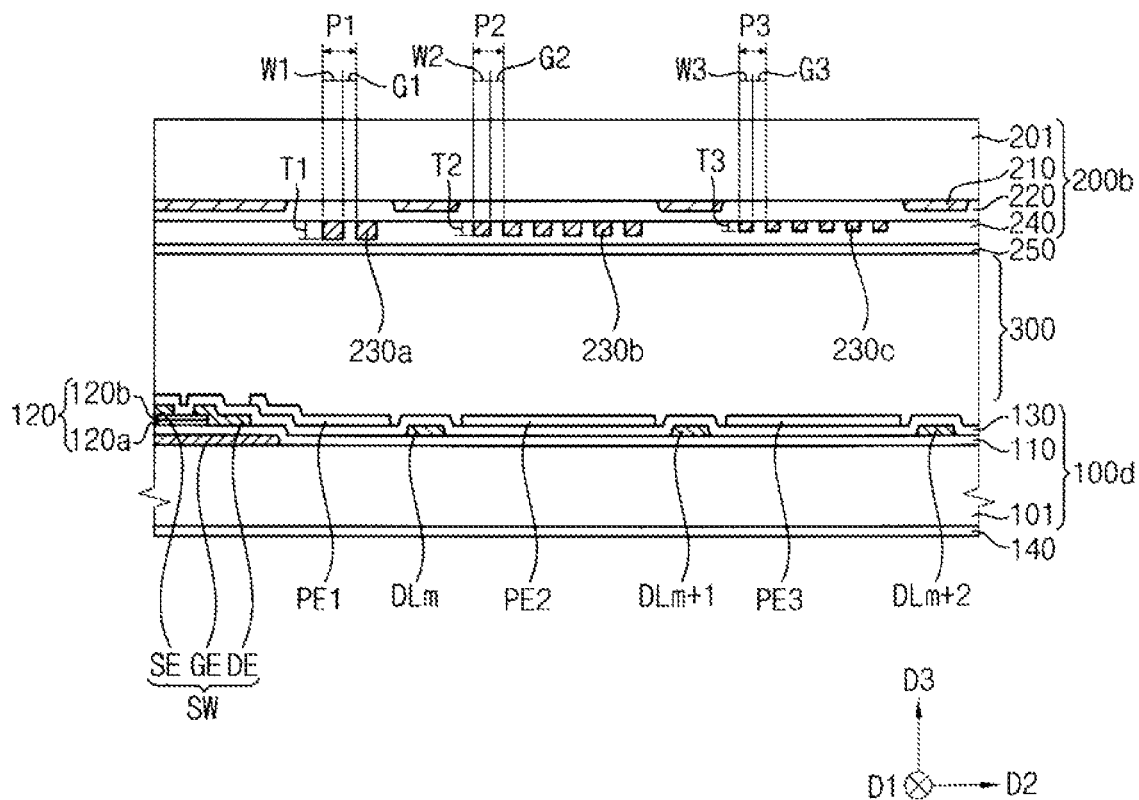
FIG. 16 is a cross-sectional view illustrating a display device in accordance with Example Embodiment 5 of the present invention.

FIG. 16 is a cross-sectional view illustrating a display device in accordance with Exemplary Embodiment 5 of the present invention.

Referring to FIG. 16, a display device in accordance with Exemplary Embodiment 5 of the present invention includes a first display substrate 100d, a second display substrate 200b facing the first display substrate 100d, and a liquid crystal layer 300 interposed between the first display substrate 100d and the second display substrate 200b.

The first display substrate 100d includes a first base substrate 101. A gate electrode GE, a gate insulation layer 110, an active pattern 120, a source electrode SE, a drain electrode DE, a plurality of data lines DLm, DLm+1 and DLm+2, a passivation layer 130 and a plurality of pixel electrodes PE1, PE2 and PE3 may be formed on the first base substrate 101.

The gate insulation layer 110 is formed on the first base substrate 101 on which the gate electrode GE is formed.

The active pattern 120 is formed at a region corresponding to a thin-film transistor SW on the gate insulation layer 110. The active pattern 120 includes a semiconductor layer 120a and an ohmic contact layer 120b.

The data lines DLm, DLm+1 and DLm+2 extend in a first direction D1 on the gate insulation layer 110.

The source electrode SE overlaps with the active pattern 120. The drain electrode DE is separated from the source electrode SE, and is formed to overlap the active pattern 120.

The passivation layer 130 may be formed on the first base substrate 101 including the source electrode SE, the drain electrode DE and the data lines DLm, DLm+1 and DLm+2.

The pixel electrodes PE1, PE2 and PE3 contain a transparent conductive material. The pixel electrodes PE1, PE2 and PE3 are formed on the passivation layer 130. For example, the pixel electrode PE1 is electrically connected to the drain electrode DE through a contact hole (not illustrated) of the passivation layer 130.

The first display substrate 100d may further include a lower polarization plate 140 disposed on a surface of the first base substrate 101 opposite to the surface on which the gate electrode GE is formed.

The second display substrate 200b may include a second base substrate 201, a light-blocking layer 210, a first dielectric layer 220, a plurality of first nano metal wires 230a, a plurality of second nano metal wires 230b, a plurality of third nano metal wires 230c, a second dielectric layer 240 and a common electrode 250.

The light-blocking layer 210 may be formed at a boundary between two regions of adjacent color pixel regions R, G and B on the second base substrate 201.

The first dielectric layer 220 is formed on the second base substrate 201 on which the light-blocking layer 210 is formed. The first dielectric layer 220 may contain a dielectric material such as silicon oxide ($SiO_2$).

The first nano metal wires 230a are disposed at the first color pixel region R on the second base substrate 201 on which the first dielectric layer 220 is formed. Each of the first nano metal wires 230a may have substantially the same size as the others. The first nano metal wires 230a may have a first width W1 and a first thickness T1. The first nano metal wires 230a extend in the first direction D1. The first nano metal wires 230a may be formed at a first period P1 along a second direction D2 different from the first direction D1. The first nano metal wires 230a may be separated from each other by a first gap G1 in the second direction D2. For example, the first thickness T1 may be about 125 nm. The first gap G1 may be about 50 nm, and the first period P1 may be about 300 nm.

The second nano metal wires 230b are disposed at the second color pixel region G adjacent to the first color pixel region R. The second nano metal wires 230b have different dimensions from the first nano metal wires 230a. Each of the second nano metal wires 230b may have substantially the same size as the others. The second nano metal wires 230b may have a second width W2 and a second thickness T2. The second nano metal wires 230b extend in the first direction D1. The second nano metal wires 230b may be formed at a second period P2 along the second direction D2. The second nano metal wires 230b may be separated from each other by a second gap G2 in the second direction D2. For example, the second thickness T2 may be about 100 nm. The second gap G2 may be about 60 nm, and the second period P2 may be about 250 nm.

The third nano metal wires 230c are disposed at the third color pixel region B adjacent to the second color pixel region G. The third nano metal wires 230c have different dimensions from the second nano metal wires 230b and the first nano metal wires 230a. Each of the third nano metal wires 230c may have substantially the same size as the others. The third nano metal wires 230c may have a third width W3 and a third thickness T3. The third nano metal wires 230c extend in the first direction D1. The third nano metal wires 230c may be formed at a third period P3 along the second direction D2. The third nano metal wires 230c may be separated from each other by a third gap G3 in the second direction D2. For example, the third thickness T3 may be about 75 nm. The third gap G3 may be about 60 nm, and the third period P3 may be about 230 nm.

The first, second and third nano metal wires 230a, 230b and 230c may be formed as in one type of a stripe type, a circular type, a spiral type, etc. The first, second and third nano metal wires 230a, 230b and 230c may contain a metal such as silver (Ag), gold (Au), aluminum (Al), etc.

The second dielectric layer 240 is formed on the second base substrate 201 on which the first, second and third nano metal wires 230a, 230b and 230c are formed. The second dielectric layer 240 covers the first, second and third nano metal wires 230a, 230b and 230c, and covers the gaps G1, G2 and G3 between adjacent nano metal wires of the first, second and third nano metal wires 230a, 230b and 230c. The second dielectric layer 240 may contain substantially the same dielectric material as the first dielectric layer 220.

The common electrode 250 contains a transparent conductive material, and is formed on the second base substrate 201 on which the second dielectric layer 240 is formed. The common electrode 250 faces the pixel electrodes PE1, PE2 and PE3. The common electrode 250 may be formed on a whole surface of the second base substrate 201.

Figure 17A:
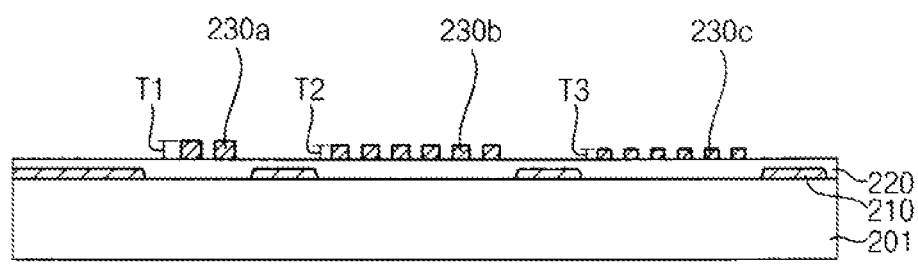
FIGS. 17A and 17B are cross-sectional views illustrating exemplary processes of manufacturing the second display substrate illustrated in FIG. 16.
Figure 17B:
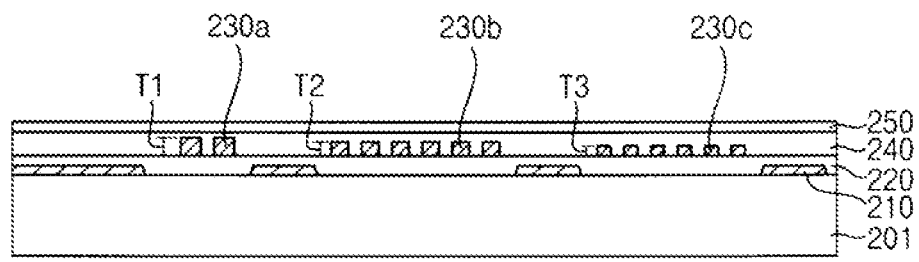

FIGS. 17A and 17B are cross-sectional views illustrating exemplary processes of manufacturing the second display substrate illustrated in FIG. 16.

Referring to FIG. 16 and FIG. 17A, the light-blocking layer 210 is formed at a boundary between two regions of adjacent color pixel regions (i.e., R, G and B in FIG. 16) that are defined on the second base substrate 201.

The first dielectric layer 220 is formed on the second base substrate 201 on which the light-blocking layer 210 is formed. The first, second and third nano metal wires 230a, 230b and 230c are formed on which the first dielectric layer 220 is formed. The method of forming the first, second and third nano metal wires 230a, 230b and 230c may be substantially the same as the method of forming the first, second and third nano metal wires 122a, 122b and 122c described with reference to FIGS. 6A to 6C. Therefore, any further descriptions concerning the same or similar elements as those shown in FIGS. 6A to 6C will be omitted.

Referring to FIG. 16 and FIG. 17B, the second dielectric layer 240 is formed on the second base substrate 201 on which the first, second and third nano metal wires 230a, 230b and 230c are formed. The second dielectric layer 240 covers the first, second and third nano metal wires 230a, 230b and 230c, and covers the gaps between adjacent nano metal wires of the first, second and third nano metal wires 230a, 230b and 230c.

The common electrode 250 is formed on the second base substrate 201 on which the second dielectric layer 240 is formed.

According to Exemplary Embodiment 5 of the present invention, a contact between the first, second and third nano metal wires 230a, 230b and 230c, and the first and second dielectric layers 220 and 240 may generate surface plasmon resonance and induce polarized color light. Therefore, a conventional color filter and a conventional lower polarization plate may be omitted, reducing the cost of manufacturing a display device. Furthermore, the simplified structure may shorten a pathway of light and reduce loss of the light, improving optical efficiency.

Exemplary Embodiment 6

Figure 18:
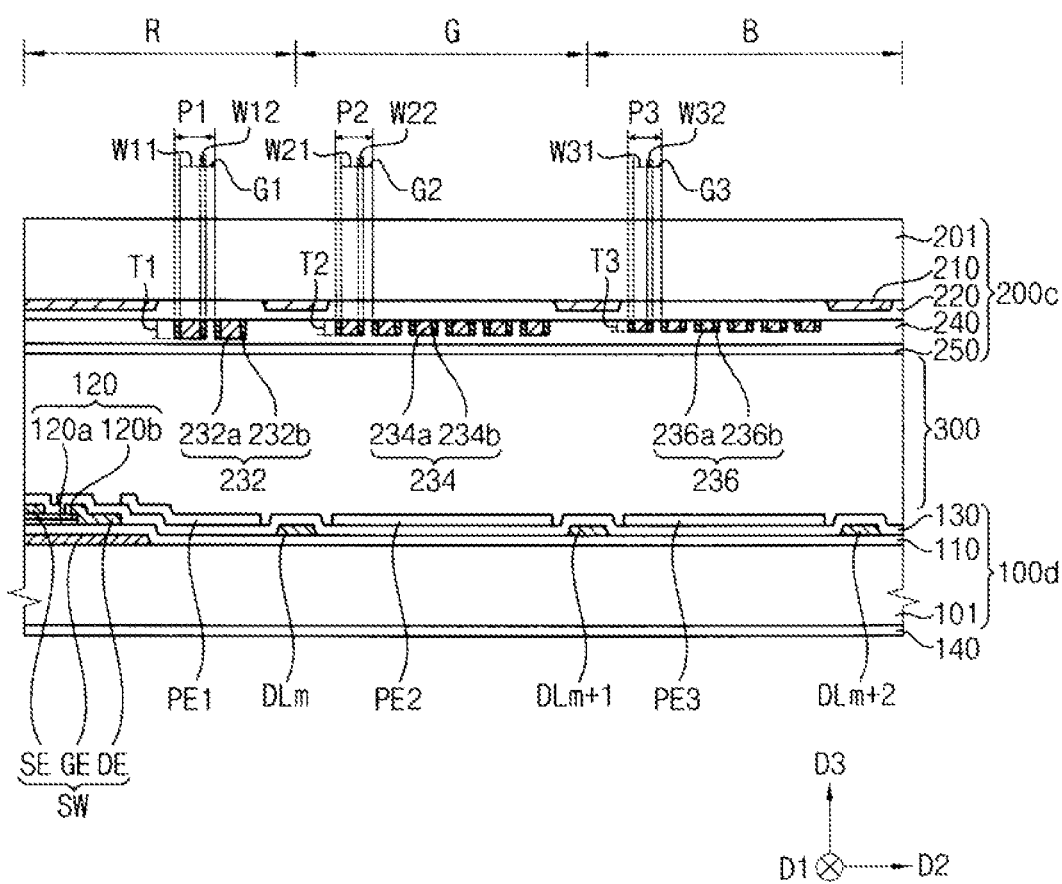
FIG. 18 is a cross-sectional view illustrating a display device in accordance with Example Embodiment 6 of the present invention.

FIG. 18 is a cross-sectional view illustrating a display device in accordance with Exemplary Embodiment 6 of the present invention.

The display device described with reference to FIG. 18 may be substantially the same as the display device described with reference to FIG. 16 except first nano metal wires 232, second nano metal wires 234 and third nano metal wires 236. Therefore, the same reference numbers are used for the same or similar elements, and any further descriptions concerning the same or similar elements as those shown in FIG. 16 will be omitted.

Referring to FIG. 18, a display device in accordance with Exemplary Embodiment 6 of the present invention includes a first display substrate 100d, a second display substrate 200c facing the first display substrate 100d, and a liquid crystal layer 300 interposed between the first display substrate 100d and the second display substrate 200c.

The first display substrate 100d includes a first base substrate 101. A gate electrode GE of a thin-film transistor SW, a gate insulation layer 110, a source electrode SE, a drain electrode DE, a plurality of data lines DLm, DLm+1 and DLm+2, a passivation layer 130 and a plurality of pixel electrodes PE1, PE2 and PE3 may be formed on the first base substrate 101.

The second display substrate 200c may include a second base substrate 201, a light-blocking layer 210, a first dielectric layer 220, a plurality of first nano metal wires 232, a plurality of second nano metal wires 234, a plurality of third nano metal wires 236, a second dielectric layer 240 and a common electrode 250.

The light-blocking layer 210 may be formed at a boundary between two regions of adjacent color pixel regions R, G and B on the second base substrate 201.

The first dielectric layer 220 is formed on the second base substrate 201 on which the light-blocking layer 210 is formed. The first dielectric layer 220 covers the light-blocking layer 210. The first dielectric layer 220 may contain a dielectric material such as silicon oxide ($SiO_2$).

The first nano metal wires 232 are formed at a first color pixel region R on the second base substrate 201 including first dielectric layer 220. The first nano metal wires 232 have a first thickness T1, and extend in a first direction D1. The first nano metal wires 232 may be periodically formed at a first period P1 along a second direction D2 different from the first direction D1. The first nano metal wires 232 may be separated from each other by a first gap G1 in the second direction D2. For example, the first thickness T1 may be about 100 nm. The first period P1 may be about 285 nm, and the first gap G1 may be about 50 nm.

The first nano metal wires 232 include a plurality of first main wires 232a and a plurality of first sub wires 232b. The first main wires 232a contain a first metal. The first main wires 232a have a first width W11.

The first sub wires 232b have a second width W12. The first sub wires 232b are adjacent to (e.g., in contact with both sides of) the first main wires 232a. The first sub wires 232b contain a second metal different from the first metal. For example, the first metal may be aluminum (Al), and the second metal may be silver (Ag). The second width W12 may be different from the first width W11.

The second nano metal wires 234 are formed at a second color pixel region G adjacent to the first color pixel region R. The second nano metal wires 234 have a second thickness T2 different from the first thickness T1. The second nano metal wires 234 extend in the first direction D1, and may be periodically formed at a second period P2 along the second direction D2. The second nano metal wires 234 may be separated from each other by a second gap G2 in the second direction D2. For example, the second thickness T2 may be about 70 nm. The second period P2 may be about 340 nm, and the second gap G2 may be about 40 nm.

The second nano metal wires 234 include a plurality of second main wires 234a and a plurality of second sub wires 234b. The second main wires 234a contain a first metal. The second main wires 234a have a third width W21. The third width W21 may be different from the first width W11.

The second sub wires 234b are adjacent to (e.g., in contact with both sides of) the second main wires 234a. The second sub wires 234b contain a second metal different from the first metal. For example, the first metal may be aluminum (Al), and the second metal may be silver (Ag). The second sub wires 234b may have a fourth width W22 different from the third width W21.

The third nano metal wires 236 are formed at a third color pixel region B adjacent to the second color pixel region G. The third nano metal wires 236 have a third thickness T3 different from the second thickness T2. The third nano metal wires 236 extend in the first direction D1, and may be periodically formed at a third period P3 along the second direction D2. The third nano metal wires 236 may be separated from each other by a third gap G3 in the second direction D2. For example, the third thickness T3 may be about 60 nm. The third period P3 may be about 280 nm, and the third gap G3 may be about 60 nm.

The third nano metal wires 236 include a plurality of third main wires 236a and a plurality of third sub wires 236b. The third main wires 236a contain a first metal. The third main wires 236a have a fifth width W31. The fifth width W31 may be different from the third width W21. The third sub wires 236b are adjacent to (e.g., in contact with both sides of) the third main wires 236a. The third sub wires 236b contain a second metal different from the first metal. For example, the first metal may be aluminum (Al), and the second metal may be silver (Ag). The third sub wires 236b may have a sixth width W32 different from the fifth width W31.

The first, second and third nano metal wires 232, 234 and 236 may be formed as one of a stripe type, a circular type, or a spiral type wire, among others. The first, second and third nano metal wires 230a, 230b and 230c may contain a metal such as silver (Ag), gold (Au), aluminum (Al), etc.

The second dielectric layer 240 is formed on the second base substrate 201 on which the first, second and third nano metal wires 232, 234 and 236 are formed. The second dielectric layer 240 covers the first, second and third nano metal wires 230a, 230b and 230c, and covers the gaps G1, G2 and G3 between adjacent nano metal wires of the first, second and third nano metal wires 232, 234 and 236. The second dielectric layer 240 may contain substantially the same dielectric material as the first dielectric layer 220.

The method of manufacturing the second display substrate 200c in accordance with Exemplary Embodiment 6 of the present invention may be substantially the same as the method of manufacturing the second display substrate 200b described with reference to FIG. 17A and FIG. 17B. Thus, any further descriptions will be omitted. Further, the method of forming the first, second and third nano metal wires 232, 234 and 236 may be substantially the same as the method of forming the first, second and third nano metal wires 170, 172 and 174 described with reference to FIGS. 13A to 13F. Thus, any further descriptions will be omitted.

According to Exemplary Embodiment 6 of the present invention, each of the first, second and third nano metal wires 232, 234 and 236 has a multi-layer structure including a main wire and a sub wire which contain different materials. Accordingly, vivid color or color with high purity may be obtained, improving display quality.

According to the above-described exemplary embodiments of the present invention, colors with a characteristic of polarization may be obtained by the combination of the first, second and third nano metal wires, and the first and second dielectric layers. Therefore, a conventional color filter and a conventional lower polarization plate may be omitted, reducing the cost of manufacturing a display device. Furthermore, the simplified structure may shorten the pathway of light and reduce light loss, improving optical efficiency. Furthermore, the first, second and third nano metal wires function as a pixel electrode and a common electrode. Therefore, processes for forming the pixel electrode and the common electrode may be omitted, simplifying the processes of manufacturing the first display substrate.

The foregoing is illustrative of the present disclosure and is not to be construed as limiting thereof. Although a few exemplary embodiments of the present invention have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of the present disclosure and is not to be construed as limited to the specific exemplary embodiments disclosed, and that modifications to the disclosed exemplary embodiments, as well as other exemplary embodiments, are intended to be included within the scope of the appended claims. Embodiments of the present invention are defined by the following claims, with equivalents of the claims to be included therein.

What is claimed is:

1. A display substrate comprising:
   a base substrate;
   a first dielectric layer disposed on the base substrate;
   a first lattice pattern disposed on the first dielectric layer at a first color pixel region, the first lattice pattern including a plurality of first nano metal wires having a first main wire and a first sub wire disposed on a side wall of the first main wire;
   a second lattice pattern disposed on the first dielectric layer at a second color pixel region, the second lattice pattern including a plurality of second nano metal wires having a second main wire and a second sub wire disposed on a side wall of the second main wire, the second nano metal wires having different dimensions from the first nano metal wires; and
   a second dielectric layer disposed on the first lattice pattern and the second lattice pattern, the second dielectric layer covering the first nano metal wires and the second nano metal wires,
   wherein a thickness of the first sub wire is different from that of the second sub wire.

2. The display substrate of claim 1, further comprising pixel electrodes formed on the first lattice pattern and the second pixel electrodes.

3. The display substrate of claim 2, wherein the first dielectric layer and the second dielectric layer contain a same dielectric material.

4. The display substrate of claim 3, wherein at least one of a width, a thickness, and an arranging period of the second nano metal wires is different from that of the first nano metal wires.

5. The display substrate of claim 2, wherein at least one of a width, a thickness, and an arranging period of the second nano metal wires is different from that of the first nano metal wires.

6. The display substrate of claim 1, further comprising common electrodes formed on the first lattice pattern and the second pixel electrodes.

7. The display substrate of claim 6, wherein the first dielectric layer and the second dielectric layer contain a same dielectric material.

8. The display substrate of claim 7, wherein at least one of a width, a thickness, and an arranging period of the second nano metal wires is different from that of the first nano metal wires.

9. The display substrate of claim 6, wherein at least one of a width, a thickness, and an arranging period of the second nano metal wires is different from that of the first nano metal wires.

10. A color display device comprising:
    a first display substrate comprising:
       a thin-film transistor formed on a first base substrate defining a first color pixel region and a second color pixel region;
       a first dielectric layer disposed on the first base substrate, the first dielectric layer covering the thin-film transistor;
       a first lattice pattern disposed on the first dielectric layer at the first color pixel region, the first lattice pattern including a plurality of first nano metal wires having a first main wire and a first sub wire disposed on a side wall of the first main wire;
       a second lattice pattern disposed on the first dielectric layer at the second color pixel region, the second lattice pattern including a plurality of second nano metal wires having a second main wire and a second sub wire disposed on a side wall of the second main wire, the second nano metal wire having different dimensions from that of the first nano metal wire; and
       a second dielectric layer disposed on the first lattice pattern and the second lattice pattern, the second dielectric layer covering the first nano metal wires and the second nano metal wires;
    a second display substrate including a second base substrate facing the first base substrate; and
    a liquid crystal layer formed between the first display substrate and the second display substrate,
    wherein a thickness of the first sub wire is different from that of the second sub wire.

11. The display device of claim 10, wherein the first and the second main wires include a first metal, and the first and the second sub wires include a second metal different from the first metal.

* * * * *